(12) United States Patent
Dai et al.

(10) Patent No.: US 9,977,455 B2
(45) Date of Patent: May 22, 2018

(54) METHOD AND APPARATUS FOR FILTERING A RECTIFIED VOLTAGE

(71) Applicant: Futurewei Technologies, Inc., Plano, TX (US)

(72) Inventors: Heping Dai, Plano, TX (US); Liming Ye, Frisco, TX (US); Dianbo Fu, Plano, TX (US)

(73) Assignee: Futurewei Technologies, Inc., Plano, TX (US)

( * ) Notice: Subject to any disclaimer, the term of this patent is extended or adjusted under 35 U.S.C. 154(b) by 10 days.

(21) Appl. No.: 15/198,056

(22) Filed: Jun. 30, 2016

(65) Prior Publication Data

US 2017/0294831 A1 Oct. 12, 2017

Related U.S. Application Data

(63) Continuation-in-part of application No. 15/095,885, filed on Apr. 11, 2016.

(51) Int. Cl.
*G05F 5/00* (2006.01)
*G01R 19/00* (2006.01)
*H02M 3/156* (2006.01)
*H02M 1/00* (2006.01)

(52) U.S. Cl.
CPC ............... *G05F 5/00* (2013.01); *G01R 19/00* (2013.01); *H02M 3/156* (2013.01); *H02M 2001/0009* (2013.01)

(58) Field of Classification Search
CPC .................. H01L 25/03; H01L 25/112; H01L 2924/3011; H02J 9/062; H02M 7/7575; H02M 7/06; H02M 7/068; H02M 7/10; H02M 3/135; H02M 3/137; H02M 3/10; H02M 3/1584; H02M 3/157; H02M 3/1582; H02M 3/158; H02M 3/155; H02M 3/1588; H02M 3/156; H02M 3/33507; H02M 3/1563; H02M 1/06; H02M 1/32; H02M 1/4208; H02M 2001/0012; H02M 2001/0032; H02M 2001/0025; H02M 2001/0009; Y02B 70/126; Y02B 70/1466; H01F 27/40; H01F 38/42; G05F 1/445; G05F 1/455; G05F 1/66; G05F 1/24
USPC .......... 363/123–126; 323/242, 259, 282–288
See application file for complete search history.

(56) References Cited

U.S. PATENT DOCUMENTS 6,819,576 B2 * 11/2004 Johnson, Jr. ............. H02J 9/061
                                                    363/123
7,760,524 B2    7/2010 Matthews
9,276,474 B2 *  3/2016 Meinecke ............. H02M 3/158
(Continued)

*Primary Examiner* — Jue Zhang
*Assistant Examiner* — Kevin H Sprenger
(74) *Attorney, Agent, or Firm* — Futurewei Technologies, Inc.

(57) ABSTRACT

A configurable impedance circuit includes a controller that senses a rectified voltage and generates a first and second control signals based on a comparison of the rectified voltage to at least one threshold voltage. The configurable impedance circuit also includes a filter for filtering the rectified voltage that couples a plurality of capacitors in series to the rectified voltage in a first configuration based on the first control signal and couples the plurality of capacitors in parallel to the rectified voltage in a second configuration based on the second control signal.

18 Claims, 12 Drawing Sheets

(56) References Cited

U.S. PATENT DOCUMENTS

| | | | |
|---|---|---|---|
| 2011/0080102 A1* | 4/2011 | Ge | H05B 33/0815 315/200 R |
| 2013/0026835 A1* | 1/2013 | Ghosh | H02J 9/062 307/66 |
| 2014/0111005 A1* | 4/2014 | Liu | H02J 9/04 307/20 |
| 2016/0006295 A1* | 1/2016 | Yang | H02J 9/062 307/66 |

* cited by examiner

METHOD AND APPARATUS FOR FILTERING A RECTIFIED VOLTAGE

The present application is a continuation-in-part of application Ser. No. 15/095,885, filed Apr. 11, 2016 and entitled "Method and Apparatus for Filtering A Rectified Voltage Signal," which is incorporated herein by reference as if reproduced in its entirety.

TECHNICAL FIELD

The present disclosure relates generally to energy storage circuits, and, in particular, to a method and apparatus for filtering a rectified voltage.

BACKGROUND

An alternating current to direct current (AC-to-DC) power supply is widely used to convert an alternating current (AC) voltage to a direct current (DC) voltage to provide power to a load. As illustrated in FIG. 1, a prior art power supply includes a rectifier and a bulk capacitor for energy storage. The rectifier rectifies an AC voltage received from an AC power source into a rectified DC voltage. The bulk capacitor receives and filters the rectified voltage to produce a DC voltage with reduced ripple and provides the DC voltage to a load.

The DC voltage provided to the load may need to stay in regulation for a certain amount of time after the AC power source is removed or fails. The amount of time the power supply continues to regulate after the AC power source is removed is referred to as hold-up time. During the hold-up time, the bulk capacitor operates to provide the necessary temporary power for the load as it discharges. In most AC-to-DC power supplies the minimum hold-up time is required to be the time necessary to maintain voltage regulation for at least one missing AC cycle of the AC power source.

In order to provide a desired DC voltage in different countries, the AC-to-DC power supplies are configured to operate for a wide range of AC input voltage. The volume of the bulk capacitor is influenced by the value and the voltage rating of the bulk capacitor. Therefore, bulk capacitors having a large volume are needed due to the high capacitance values demanded by the minimum AC input voltage combined with very high voltage ratings demanded by the maximum AC input voltage. Not only is the size of such bulk capacitors large, their cost is also relatively high. Since a physical size and a cost of the power supply are strongly influenced by the cost and size of the bulk capacitor, the conventional power supply is bulky in size and also costly.

SUMMARY

In one embodiment, a configurable impedance circuit is disclosed that includes a controller that senses a rectified voltage and generates a first and second control signals based on a comparison of the rectified voltage to at least one threshold voltage. The configurable impedance circuit also includes a filter for filtering the rectified voltage that couples a plurality of capacitors in series to the rectified voltage in a first configuration based on the first control signal and couples the plurality of capacitors in parallel to the rectified voltage in a second configuration based on the second control signal.

In another embodiment, a power supply is disclosed that includes a rectifier that receives an AC voltage and rectifies the AC voltage to produce a rectified voltage and a configurable impedance circuit coupled to receive and filter the rectified voltage to produce a filtered DC voltage. The configurable impedance circuit includes a controller that senses the rectified voltage and generates a first and second control signals based on a comparison of the rectified voltage to at least one threshold voltage and a filter that couples a plurality of capacitors in series to the rectified voltage in a first configuration based on the first control signal and couples the plurality of capacitors in parallel to the rectified voltage in a second configuration based on the second control signal. The power supply also includes a DC/DC converter that receives the filtered DC voltage and converts the filtered DC voltage to provide a converted DC voltage to a load.

In another embodiment, a method for filtering a rectified voltage is disclosed that includes filtering the rectified voltage with a plurality of capacitors, sensing the rectified voltage and generating a first and second control signals based on a comparison of the rectified voltage to at least one threshold voltage, coupling the plurality of capacitors in series to the rectified voltage in response to the first control signal, and coupling the plurality of capacitors in parallel to the rectified voltage in response to the second control signal.

In yet another embodiment, another configurable impedance circuit is disclosed that includes a controller that senses a rectified voltage and generates a first and second control signals based on a comparison of the rectified voltage to at least one threshold voltage. The configurable impedance circuit also includes a filter for filtering the rectified voltage that couples a first capacitor and a second capacitor in series to the rectified voltage upon a switch being open in response to the first control signal and couples the first capacitor and the switch in series to the rectified voltage upon the switch being closed in response to the second control signal.

BRIEF DESCRIPTION OF THE DRAWINGS

For a more complete understanding of the present disclosure, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

It should be understood at the outset that although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Figure 2A:
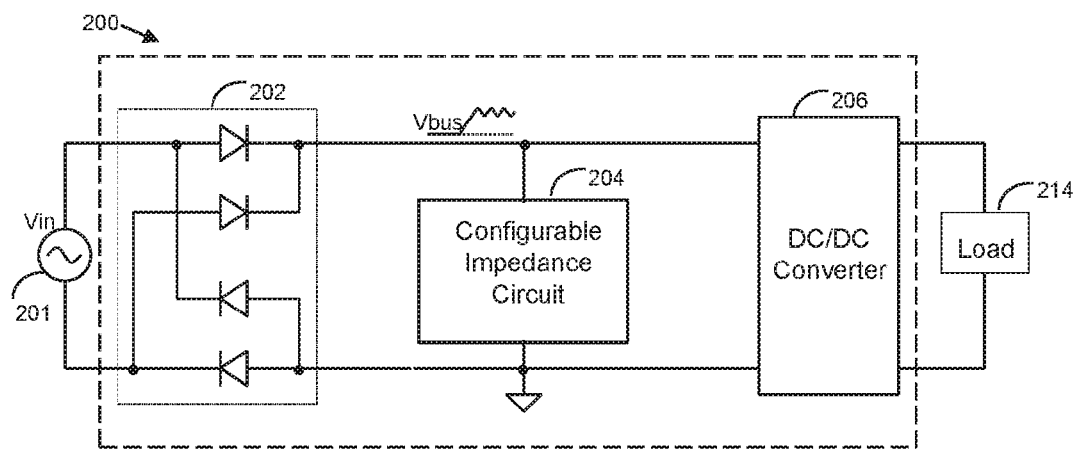
FIG. 2A illustrates a simplified block diagram of a power supply, according to one embodiment of the present disclosure.

FIG. 2A illustrates a simplified block diagram of a power supply 200, according to one embodiment of the present disclosure. The power supply 200 can be used to provide power to a load 214. As illustrated in FIG. 2A, the power supply 200 is coupled to receive an alternating current (AC) voltage from an AC power source 201. Power supply 200 includes a rectifier 202 that receives the AC voltage to produce a rectified voltage, a configurable impedance circuit 204 coupled to receive the rectified voltage to produce a filtered DC voltage and a DC/DC converter 206 coupled to receive the filtered DC voltage to produce a DC-to-DC output voltage. As is known, the DC/DC converter 206 typically converts a DC voltage from one magnitude to another. This feature is often necessary for different components or circuits or devices that have differing DC supply requirements.

The AC power source 201 is capable of generating an AC input voltage Vin and providing the AC voltage Vin to the rectifier 202 of power supply 200. The rectifier 202 rectifies the AC input voltage Vin and generates a rectified voltage, labeled Vbus on the figures, to the configurable impedance circuit 204. The rectifier 202 includes a full-wave bridge rectifier in the embodiment of FIG. 2A. Any known type of rectifier may be used in place of a full-wave bridge rectifier including, for example, a half-wave rectifier. The configurable impedance circuit 204 receives and filters the rectified voltage Vbus to substantially remove ripple and to produce a filtered DC voltage. The DC/DC converter 206 is coupled to receive the filtered DC voltage, convert the filtered DC voltage from a first DC voltage level to a second DC voltage level and provide the converted DC voltage to the load 214.

Figure 2B:
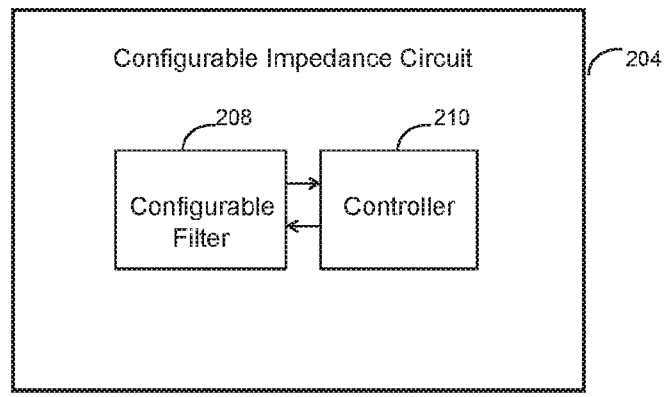
FIG. 2B illustrates a simplified block diagram of a configurable impedance circuit depicted in FIG. 2A, according to one embodiment of the present disclosure.

FIG. 2B illustrates a simplified block diagram of a configurable impedance circuit depicted in FIG. 2A, according to one embodiment of the present disclosure. For example, the configurable impedance circuit 204 of FIG. 2B may be implemented in the context of the power supply 200 as illustrated in FIG. 2A. As illustrated in FIG. 2B, the configurable impedance circuit 204 includes a configurable filter 208 and a controller 210. The controller 210 is coupled to sense the rectified voltage Vbus, and is configured to generate and send a control signal to the configurable filter 208 according to a comparison of the rectified voltage Vbus to at least one threshold voltage. The configurable filter 208 for filtering the rectified voltage Vbus couples a plurality of capacitors in series to the rectified voltage Vbus in a first configuration and couples the plurality of capacitors in parallel to the rectified voltage Vbus in a second configuration based upon a state of the control signal. The control signal causes the configurable filter 208 to select the first or the second configuration based upon the state of the control signal. In one example, the controller 210 sends the first control signal (i.e., the control signal in a first state) to cause the configurable filter 208 to select the first configuration when the rectified voltage Vbus is greater than or equal to a first threshold voltage. In another example, the controller 210 sends a second control signal signal (i.e., the control signal in a second state) to cause the configurable filter 208 to select the second configuration when the rectified voltage Vbus is less than or equal to a second threshold voltage. One aspect of the configurable filter 208 of the present disclosure is that the total physical size and cost of the capacitor(s) are reduced while providing a wide voltage operating range. The size and cost of the power supply is reduced accordingly.

In another embodiment, the controller 210 of the configurable impedance circuit 204 is connected to sense a differential voltage across at least one capacitor $V(C_{LV})$ in the configurable filter 208, and is configured to generate a control signal Vctrl based on the differential voltage across the capacitor. In particular, the controller 210 includes logic configured to maintain a voltage range across the capacitor by generating control signals to the configurable filter 208 to control the operation and filter configuration of the configurable filter 208. The detailed operation of the configurable impedance circuit 204 will be described in relation with FIGS. 10-12.

Figure 3:
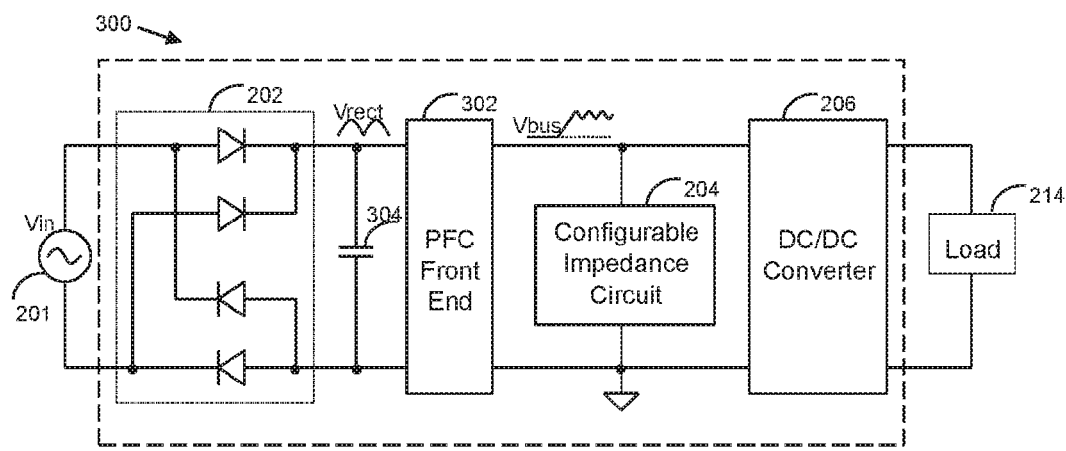
FIG. 3 illustrates a simplified block diagram of a power supply, according to another embodiment of the present disclosure.

FIG. 3 illustrates a simplified block diagram of a power supply 300, according to one embodiment of the present disclosure. It is understood that elements labeled or numbered the same as in FIG. 2A have similar functions. Commonly labeled or numbered elements won't be described again for the sake of conciseness. The main difference between the embodiment in FIG. 3 and the embodiment in FIG. 2A is that: in the example shown in FIG. 3, the power supply 300 further includes a capacitor 304 and a power factor correction (PFC) front end 302 coupled between the rectifier 202 and the configurable impedance circuit 204. PFC front end 302 is configured to reduce or remove a phase difference between current and voltage signals. The capacitor 304 produces a voltage Vrect. The PFC front end 302 is configured to regulate the voltage Vrect to produce the voltage Vbus to satisfy transient response requirements including phase correlation of voltage and current of the power supply.

Figure 4A:
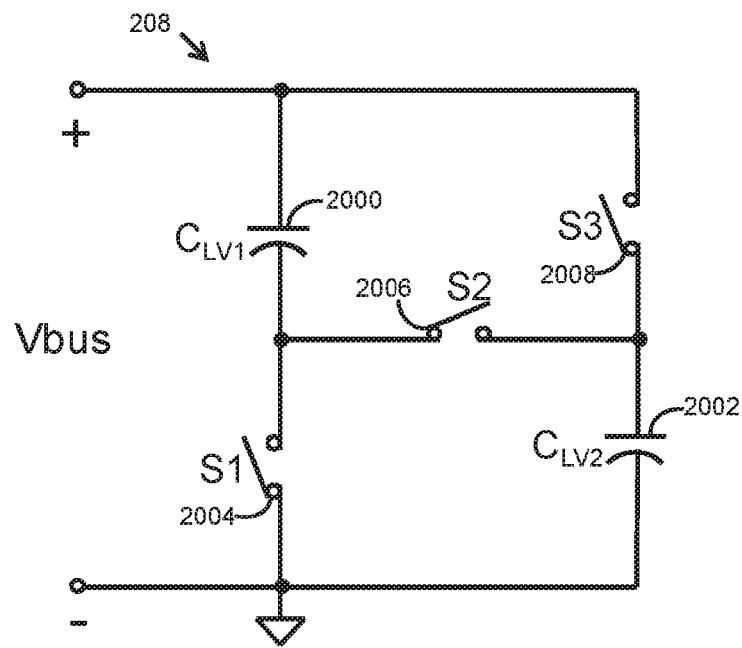
FIGS. 4A-4D illustrate various operations of a configurable filter depicted in FIG. 2B, according to one embodiment of the present disclosure.

The configurable filter 208 is further described in the following detailed descriptions. FIGS. 4A-4D illustrate various operations of a configurable filter depicted in FIG. 2B, according to one embodiment of the present disclosure. As illustrated in FIG. 4A, the configurable filter 208 includes a capacitor $C_{LV1}$ 2000, a capacitor $C_{LV2}$ 2002, a switch S1 2004, a switch S2 2006 and a switch S3 2008. The rectified voltage Vbus is a positive voltage in relation to a common input return. One terminal of the capacitor $C_{LV1}$ 2000 is coupled to the rectified voltage Vbus. The other terminal of the capacitor $C_{LV1}$ 2000 is coupled to the switch S1 2004 that couples between the capacitor $C_{LV1}$ 2000 and the common input return and the switch S2 2006 that couples between the capacitor $C_{LV1}$ 2000 and the capacitor $C_{LV2}$ 2002. One terminal of the capacitor $C_{LV2}$ 2002 is coupled to the switch S2 2006 and the switch S3 2008 that couples between the rectified voltage Vbus and the capacitor $C_{LV2}$ 2002. The other terminal of the capacitor $C_{LV2}$ 2002 is coupled to the switch S1 2004 through the common input return.

Figure 4B:
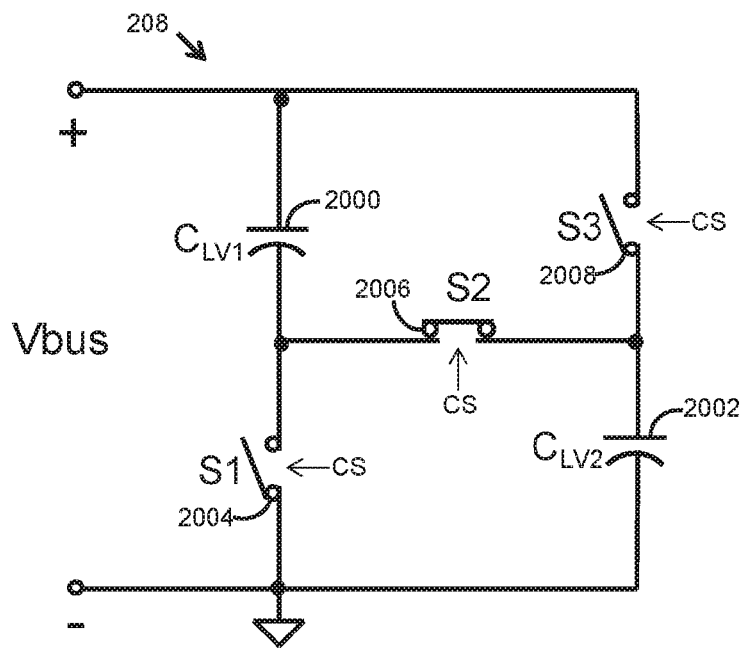

In one example, referring to the embodiment of FIG. 2B, the configurable filter 208 receives the first control signal to select the first configuration, i.e., coupling the capacitor $C_{LV1}$ 2000 and the capacitor $C_{LV2}$ 2002 in series to the rectified voltage Vbus when the rectified voltage Vbus is sensed to be greater than or equal to a first threshold voltage $V_{THH}$. FIG. 4B illustrates the operation of the configurable filter 208 depicted in FIG. 4A upon receiving the first control signal (CS). It is understood that elements labeled or numbered the same as in FIG. 4A have similar functions. Commonly labeled or numbered elements won't be described again for the sake of conciseness. As shown in FIG. 4B, the configurable filter 208 closes the switch S2 2006 and opens the switch S1 2004 and switch S3 2008 in response to the first control signal received from the controller 210. As a result, the capacitor $C_{LV1}$ 2000 and the capacitor $C_{LV2}$ 2002 are coupled in series to the rectified voltage Vbus, where the switch S2 2006 is closed to couple capacitor $C_{LV1}$ 2000 in series with the capacitor $C_{LV2}$ 2002.

Figure 4C:
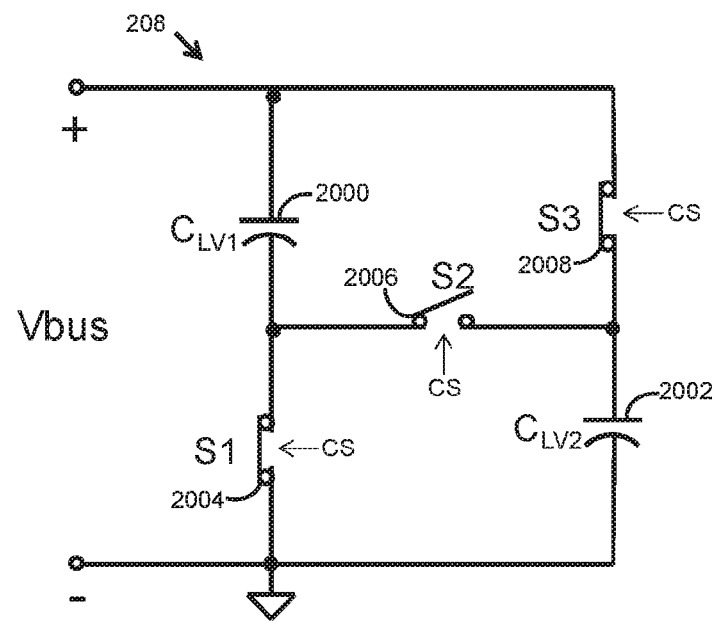

In another example, referring to the embodiment of FIG. 2B, the configurable filter 208 receives the second control signal to select the second configuration, i.e., coupling the capacitor $C_{LV1}$ 2000 and the capacitor $C_{LV2}$ 2002 in parallel to the rectified voltage Vbus when the rectified voltage Vbus is sensed to be less than or equal to a second threshold voltage $V_{THL}$. FIG. 4C illustrates the operation of the configurable filter 208 depicted in FIG. 4A upon receiving the second control signal. It is understood that elements labeled or numbered the same as in FIG. 4A have similar functions. As shown in FIG. 4C, the configurable filter 208 closes the switch S1 2004 and switch S3 2008 and opens the switch S2 2006 in response to the second control signal received from the controller 210. As a result, the capacitor $C_{LV1}$ 2000 and the capacitor $C_{LV2}$ 2002 are coupled in parallel to the rectified voltage Vbus. The switch S1 2004 couples in series with the capacitor $C_{LV1}$ 2000, the switch S3 2008 couples in series with the capacitor $C_{LV2}$ 2002, and the switch S1 2004 and the capacitor $C_{LV1}$ 2000 are coupled in parallel with the switch S3 2008 and the capacitor $C_{LV2}$ 2002. In one embodiment, depending on the configurations, a combination of normally open and normally closed switches are used so that one control signal may be used to drive some switches to a closed state and others to an open state.

Figure 4D:
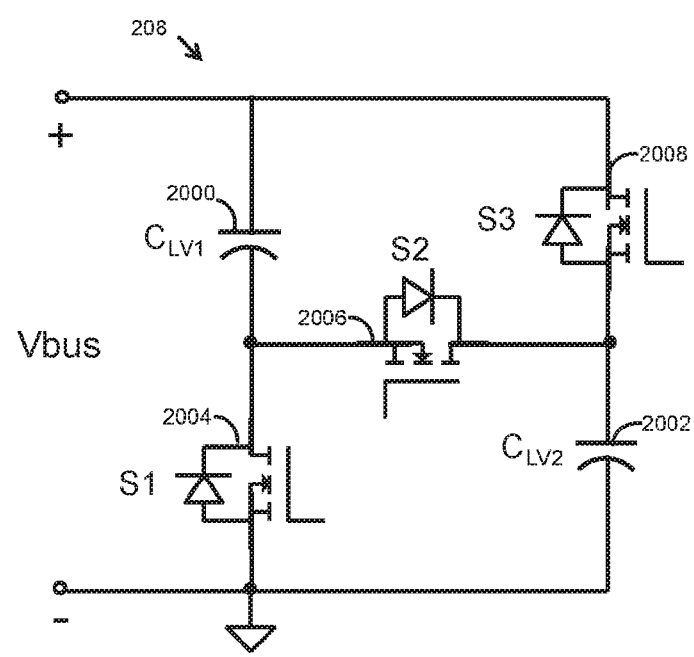

In yet another example, in the example configurable filter 208 as illustrated in FIG. 4D, each switch of the switches S1, S2 and S3 include a metal-oxide-semiconductor field-effect transistor (MOSFET). For example, the polarity of the switch S2 needs to be positioned as shown in FIG. 4D so that it can block the rectified voltage Vbus when the Vbus is less than or equal to the threshold voltage $V_{THL}$ and the switches S1 and S3 are turned on. In one particular example, a combination of enhancement mode and depletion modes metal-oxide-semiconductor field-effect transistors (MOSFETs) are utilized. It is understood that the configurable filter 208 in FIG. 4D may be operated in the similar way as described in the embodiments of FIGS. 4B-4C. The detailed operation won't be described again for the sake of conciseness.

In the embodiments as shown in FIGS. 4A-4D, it is understood that each of the capacitor $C_{LV1}$ 2000 and the capacitor $C_{LV2}$ 2002 may be realized by one or more individual capacitors.

Figure 4E:
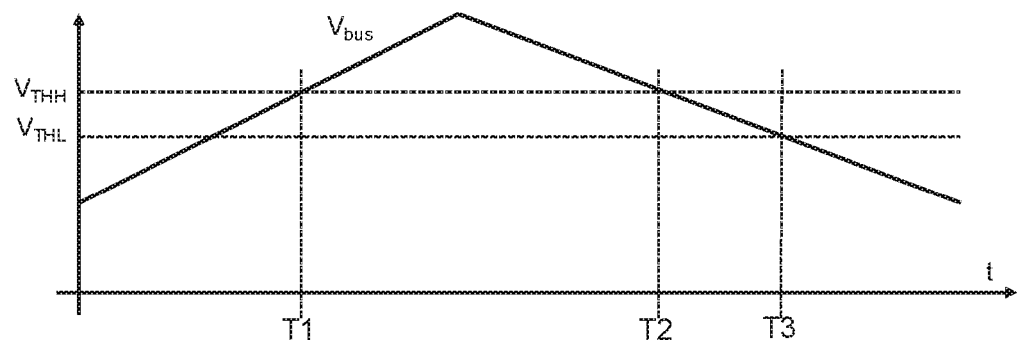
FIG. 4E illustrates a waveform diagram of a rectified voltage Vbus in connection with a first threshold voltage $V_{THH}$ and a second voltage $V_{THL}$, according to one embodiment of the present disclosure.

In one example, the threshold voltage $V_{THH}$ may be equal to the threshold voltage $V_{THL}$. In another example, hysteresis is introduced in the configurable impedance circuit 204 with the threshold voltage $V_{THH}$ that is greater than the threshold voltage $V_{THL}$. FIG. 4E illustrates a waveform diagram of the rectified voltage Vbus in connection with the threshold voltage $V_{THH}$ and the threshold voltage $V_{THL}$, where the threshold voltage $V_{THH}$ is greater than the threshold voltage $V_{THL}$. The embodiment of FIG. 4E will be describes in detail in combination with the operations of the configurable filter 208 as shown in FIGS. 4A-4D. When the rectified voltage Vbus is rising but the rectified voltage Vbus is less than the threshold voltage $V_{THH}$, the switch S2 2006 is open and the switches S1 and S3 are closed. As a result, the capacitor $C_{LV1}$ 2000 and the capacitor $C_{LV2}$ 2002 are coupled in parallel to the rectified voltage Vbus. At time T1, in response to the rectified voltage Vbus rising to the threshold voltage $V_{THH}$, the switch S2 2006 is closed and the switches S1 and S3 are opened in response to the first control signal. The capacitor $C_{LV1}$ 2000 and the capacitor $C_{LV2}$ 2002 are thus coupled in series. When the rectified voltage Vbu drops below the threshold voltage $V_{THH}$ at time T2, the switch S2 2006 remains closed and the switches S1 and S3 remain opened. Until the rectified voltage Vbu drops below the threshold voltage $V_{THL}$ at time T3, the switch S2 2006 is open and the switches S1 and S3 are closed in response to the second control signal generated base on the rectified voltage Vbus. The capacitor $C_{LV1}$ 2000 and the capacitor $C_{LV2}$ 2002 are thus coupled in parallel. Through the threshold voltage $V_{THH}$ and the threshold voltage $V_{THL}$, hysteresis is provided to prevent frequent switching.

In order to provide a desired DC voltage in different countries, the power supply 200 needs to operate for a wide range of the AC input voltage Vin. For example, in some countries or regions, the amplitude of the AC input voltage Vin is approximately 110 volts while in some others, the amplitude may be approximately 220 volts. The power supply 200 is typically required to provide its normal output for a short time after the AC input voltage is removed so that the electronic circuits that receive power from the power supply 200 can perform necessary tasks before the electronic circuits lose power. The amount of time the power supply continues to operate after the AC input is removed is referred to as hold-up time. During the hold-up time, the capacitors $C_{LV1}$ 2000 and $C_{LV2}$ 2002 provide the energy to the DC-to-DC converter 206.

The energy available from capacitors including $C_{LV1}$ 2000 and $C_{LV2}$ 2002 is proportional to the value of the capacitance and to the square of the voltage on the capacitance. Take an example that the high input voltage is approximately 220 volts and the low input voltage is approximately 110 volts. In this illustrative example, the capacitance required at the low input voltage to provide for the same amount of hold-up time is roughly four times at the high input voltage. The capacitance of $C_{LV1}$ 2000 is equal to the capacitance of $C_{LV2}$ 2002, with the same voltage rating. It is assumed that the capacitance, the voltage rating and the volume for each of $C_{LV1}$ 2000 and $C_{LV2}$ 2002 at the high input voltage Vin are $CAP_{LV}$, VTH and VOL, respectively. Usually, the volume of a capacitor is a function of its capacitance and a square of its voltage rating. According to the solution of the present disclosure, to maintain the same hold-up time for both high input voltage and low input voltage, the total volume VOL' of the bulk capacitor including $C_{LV1}$ 2000 and $C_{LV2}$ 2002 required according to the present disclosure is calculated according to below equation (1):

$$VOL'=VOL_{LV1}+VOL_{LV2}=VOL+VOL=2VOL. \qquad (1)$$

Figure 1:
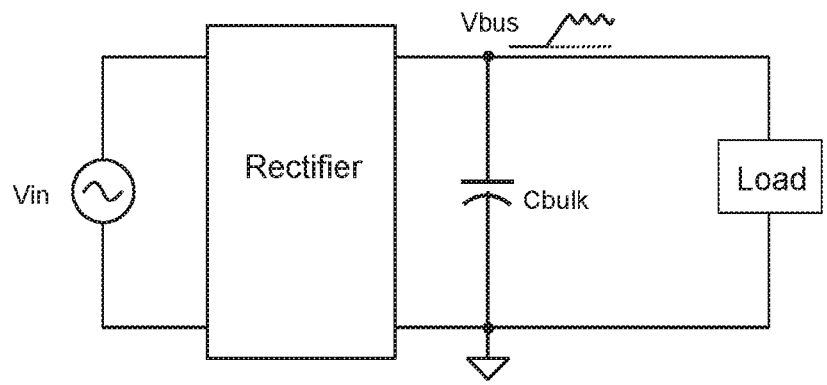
FIG. 1 illustrates a prior art power supply.

However, when applied to a prior art power supply as illustrate in FIG. 1, to maintain the same hold-up time for both high input voltage and low input voltage, the volume of the bulk capacitor for the prior art power supply is $4*(VOL_{LV1}+VOL_{LV2})$, i.e., 8VOL.

Therefore, in this illustrative example, the volume of the capacitors needed in a power supply is reduced by $$\frac{8VOL-2VOL}{8VOL}=75\%.$$

According to the embodiments of the present disclosure, the total physical size and cost of the bulk capacitor is reduced while providing wide operating voltage range on the bulk capacitor. The size and cost of the power supply is reduced accordingly.

Figure 5A:
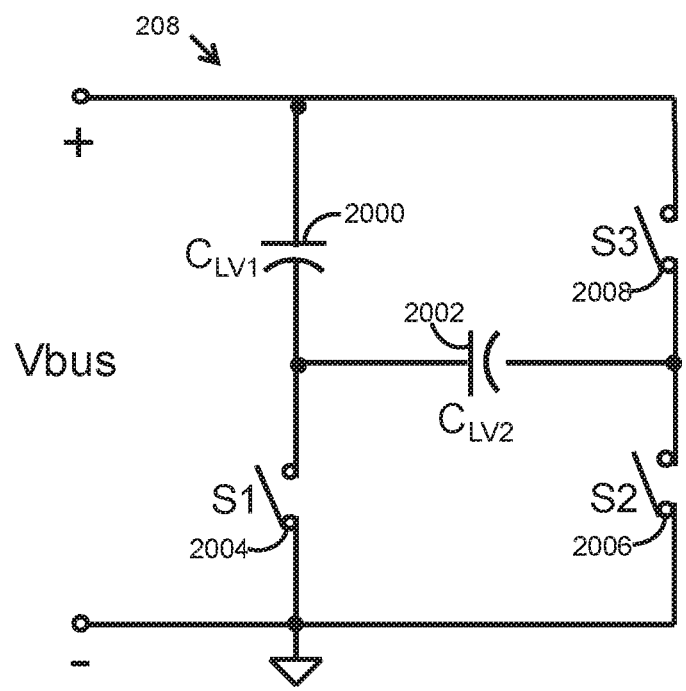
FIGS. 5A-5C illustrate various operations of a configurable filter depicted in FIG. 2B, according to another embodiment of the present disclosure.
Figure 5B:
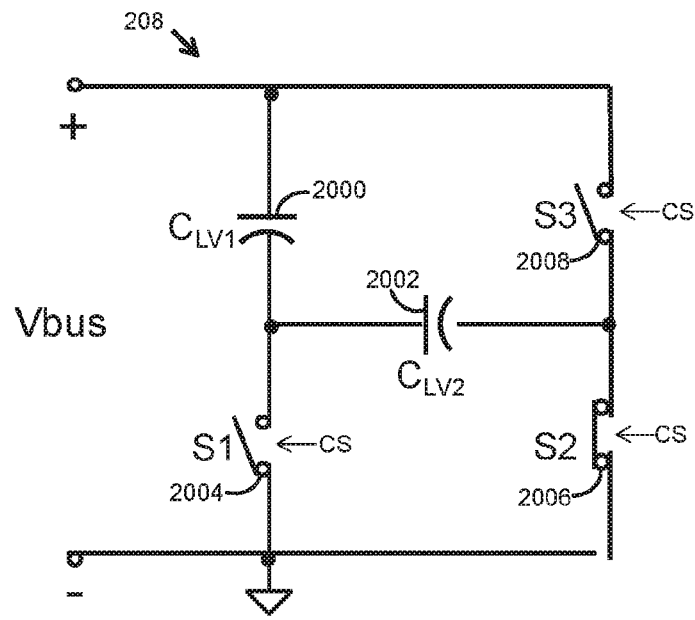
Figure 5C:
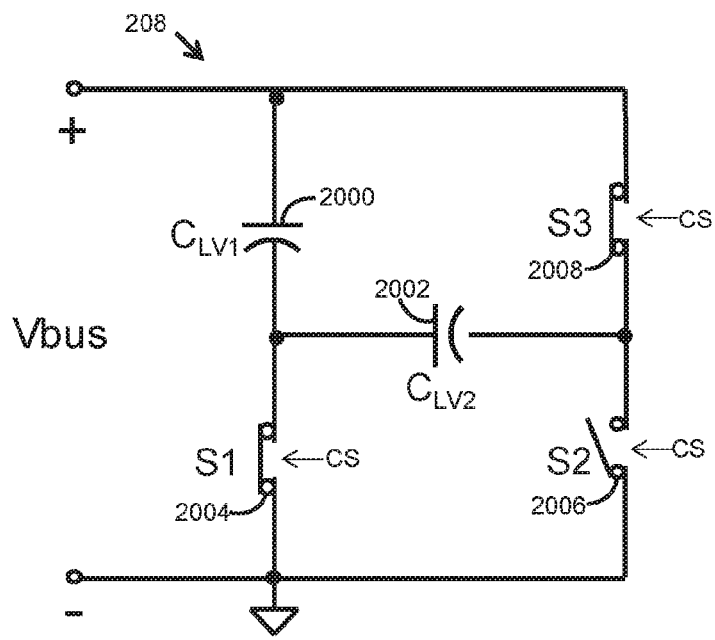

FIGS. 5A-5C illustrate various operations of a configurable filter depicted in FIG. 2B, according to another embodiment of the present disclosure. As illustrated in FIG. 5A, the configurable filter 208 includes the capacitor $C_{LV1}$ 2000, capacitor $C_{LV2}$ 2002, switch S1 2004, switch S2 2006 and switch S3 2008. The rectified voltage Vbus is a positive voltage in relation to a common input return. As opposed to the embodiment in FIG. 4A, the main difference between the embodiment of FIG. 5A and the embodiment of FIG. 4A lies in that the positions of the capacitor $C_{LV2}$ 2002 and switch S2 2006 in the logic circuit are exchanged.

In one example, referring to the embodiment of FIG. 2B, the configurable filter 208 receives the first control signal to select the first configuration, i.e., coupling the capacitor $C_{LV1}$ 2000 and the capacitor $C_{LV2}$ 2002 in series to the rectified voltage Vbus when the rectified voltage Vbus is sensed to be greater than or equal to the threshold voltage $V_{THH}$. FIG. 5B illustrates the operation of the configurable filter 208 depicted in FIG. 5A upon receiving the first control signal. It is understood that elements labeled or numbered the same as in FIG. 5A have similar functions. Commonly labeled or numbered elements won't be described again for the sake of conciseness. As shown in FIG. 5B, the configurable filter 208 closes the switch S2 2006 and opens the switch S1 2004 and switch S3 2008 in response to the first control signal received from the controller 210. Consequently, the capacitor $C_{LV1}$ 2000 and the capacitor $C_{LV2}$ 2002 are coupled in series to the rectified voltage Vbus, where the switch S2 2006 is closed and coupled between the capacitor $C_{LV2}$ 2002 and the common input return.

In another example, referring to the embodiment of FIG. 2B, the configurable filter 208 receives the second control signal to select the second configuration, i.e., coupling the capacitor $C_{LV1}$ 2000 and the capacitor $C_{LV2}$ 2002 in parallel to the rectified voltage Vbus when the rectified voltage Vbus is sensed to be less than or equal to the threshold voltage $V_{THL}$. FIG. 5C illustrates the operation of the configurable filter 208 depicted in FIG. 5A upon receiving the second control signal. It is understood that elements labeled or numbered the same as in FIG. 5A have similar functions. As shown in FIG. 5C, the configurable filter 208 closes the switch S1 2004 and switch S3 2008 and opens the switch S2 2006 in response to the second control signal received from the controller 210. As a consequence, the capacitor $C_{LV1}$ 2000 and the capacitor $C_{LV2}$ 2002 are coupled in parallel to the rectified voltage Vbus. Under the circumstances, the switch S3 2008 couples in series with the capacitor $C_{LV2}$ 2002, and the switch S3 2008 and the $C_{LV2}$ 2002 are coupled in parallel with the capacitor $C_{LV1}$ 2000.

While not shown in FIGS. 5A-5C, it is explicitly understood that, in some embodiments, each switch of the switches S1 2004, S2 2006 and S3 2008 may include a MOSFET device. In one particular example, a combination of enhancement mode and depletion modes MOSFETs are utilized. It is also understood that each of the capacitor $C_{LV1}$ 2000 and the capacitor $C_{LV2}$ 2002 may be realized by one or more individual capacitors. In one example, the threshold voltage $V_{THH}$ may be equal to the threshold voltage $V_{THL}$. In another example, hysteresis is introduced in the configurable impedance circuit 204 with the threshold voltage $V_{THH}$ that is greater than the threshold voltage $V_{THL}$.

In order to provide a desired DC voltage in different countries, the power supply 200 needs to operate for a wide range of the AC input voltage Vin. In the embodiments as shown in FIGS. 5A-5C, take an example that the high input voltage is approximately 220 volts and the low input voltage is approximately 110 volts. The capacitance of $C_{LV1}$ 2000 is equal to the capacitance of $C_{LV2}$ 2002, with the same voltage rating. Similar to the calculation of volume reduction as described in the embodiments of FIGS. 4A-4D, the volume of the capacitors needed in a power supply as illustrated in FIGS. 5A-5C is reduced by 75%, compared to the prior art. The total physical size and cost of the bulk capacitor is reduced while providing wide operating voltage range on the bulk capacitor. The size and cost of the power supply is reduced accordingly.

Figure 6A:
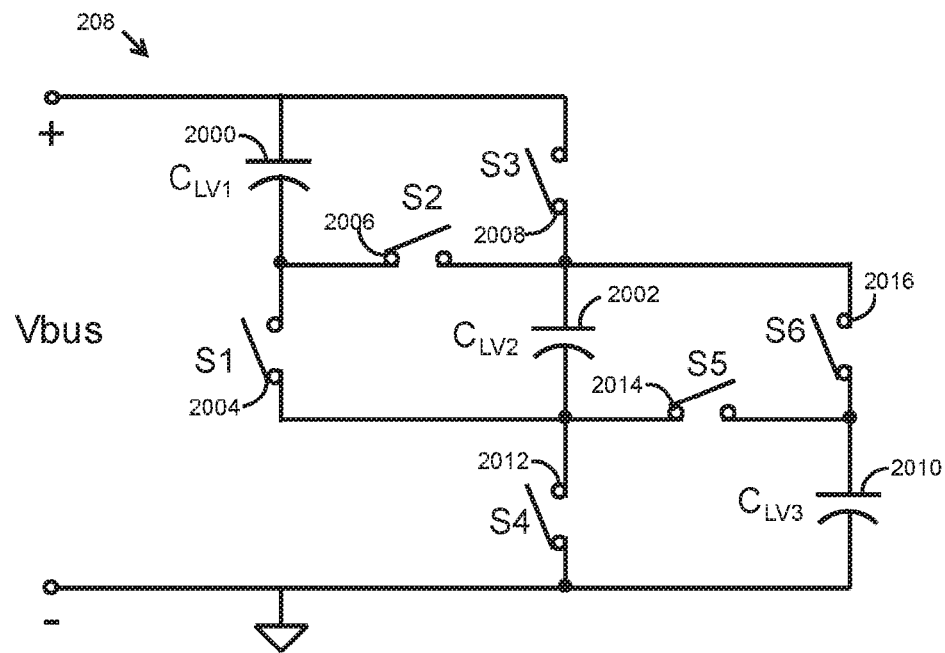
FIGS. 6A-6C illustrate various operations of a configurable filter depicted in FIG. 2B, according to another embodiment of the present disclosure.
Figure 6B:
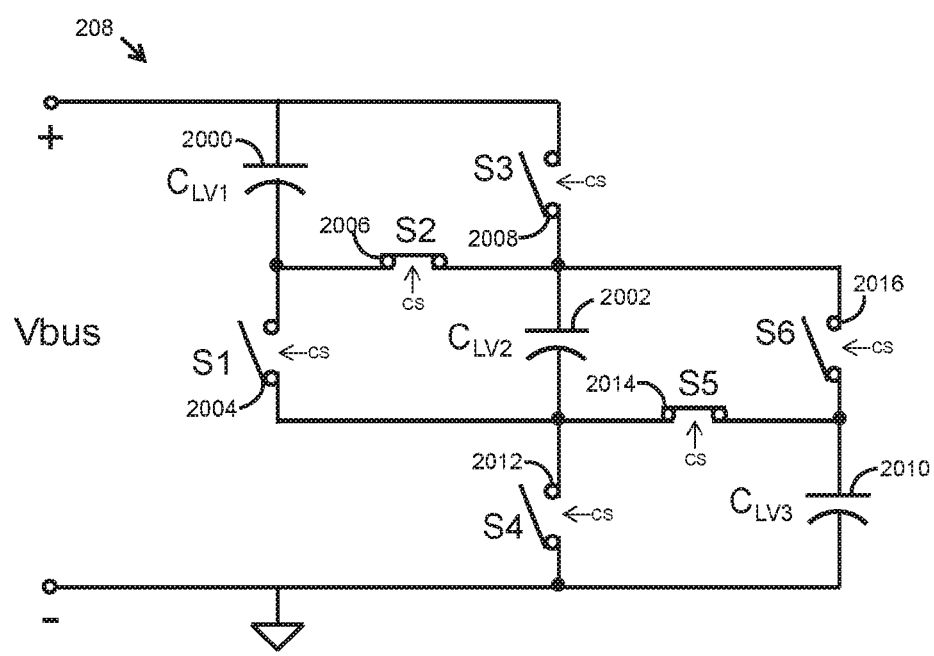
Figure 6C:
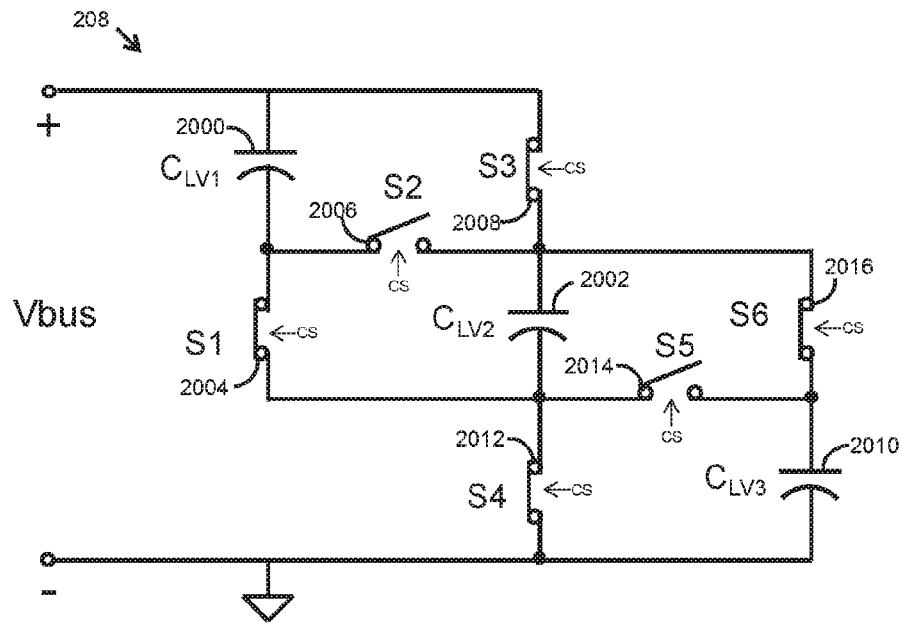

In some embodiments, the configurable filter 208 depicted in FIG. 4A may be extended to multiple levels structures. For example, the configurable filter 208 depicted in FIG. 4A may be extended to three level structure as illustrated in FIGS. 6A-6C. While three levels structures are shown in FIGS. 6A-6C, it is expressly contemplated that any number of levels may be implemented in the configurable filter 208, and the selection of three is purely for the purpose of convenience.

FIGS. 6A-6C illustrate various operations of a configurable filter depicted in FIG. 2B, according to another embodiment of the present disclosure. In contrast with the embodiment as shown in FIG. 4A, the configurable filter 208 as illustrated in FIG. 6A further includes a capacitor $C_{LV3}$ 2010, a switch S4 2012, a switch S5 2014 and a switch S6 2016.

In one example, referring to the embodiment of FIG. 2B, the configurable filter 208 receives the first control signal to select the first configuration, i.e., coupling the capacitor $C_{LV1}$ 2000, the capacitor $C_{LV2}$ 2002 and the capacitor $C_{LV3}$ 2010 in series to the rectified voltage Vbus when the rectified voltage Vbus is sensed to be greater than or equal to the threshold voltage $V_{THH}$. FIG. 6B illustrates the operation of the configurable filter 208 depicted in FIG. 6A upon receiving the first control signal. It is understood that elements labeled or numbered the same as in FIG. 6A have similar functions. Commonly labeled or numbered elements won't be described again for the sake of conciseness. As shown in FIG. 6B, the configurable filter 208 closes the switch S2 2006 and the switch S5 2014, and opens the switch S1 2004, switch S3 2008, switch S4 2012 and switch S6 2016 in response to the first control signal received from the controller 210. As a result, the capacitor $C_{LV1}$ 2000, the capacitor $C_{LV2}$ 2002 and the capacitor $C_{LV3}$ 2010 are coupled in series to the rectified voltage Vbus, where the switch S2 2006 is coupled between the capacitor $C_{LV1}$ 2000 and the capacitor $C_{LV2}$ 2002 and the switch S5 2014 is coupled between the capacitor $C_{LV2}$ 2002 and the capacitor $C_{LV3}$ 2010.

In another example, referring to the embodiment of FIG. 2B, the configurable filter 208 receives the second control signal to select the second configuration, i.e., coupling the capacitor $C_{LV1}$ 2000, the capacitor $C_{LV2}$ 2002 and the capacitor $C_{LV3}$ 2010 in parallel to the rectified voltage Vbus when the rectified voltage Vbus is sensed to be less than or equal to the threshold voltage $V_{THL}$. FIG. 6C illustrates the operation of the configurable filter 208 depicted in FIG. 6A upon receiving the second control signal. It is understood that elements labeled or numbered the same as in FIG. 6A have similar functions. As shown in FIG. 6C, the configurable filter 208 closes the switch S1 2004, switch S3 2008, switch S4 2012 and switch S6 2016 and opens the switch S2 2006 and the switch S5 2014 in response to the second control signal received from the controller 210. As a result, the capacitor $C_{LV1}$ 2000, the capacitor $C_{LV2}$ 2002 and the capacitor $C_{LV3}$ 2010 are coupled in parallel to the rectified voltage Vbus. While not shown in FIGS. 6A-6C, it is explicitly understood that, in some embodiments, each switch of the switches S1 2004, S2 2006, S3 2008, S4 2012, S5 2014 and S6 2016 may include a MOSFET device. In one particular example, a combination of enhancement mode and depletion modes MOSFETs are utilized. It is also understood that each of the capacitor $C_{LV1}$ 2000, capacitor $C_{LV2}$ 2002 and capacitor $C_{LV3}$ 2010 may be realized by one or more individual capacitors. In one example, the threshold voltage $V_{THH}$ may be equal to the threshold voltage $V_{THL}$. In another example, hysteresis is introduced in the configurable impedance circuit 204 with the threshold voltage $V_{THH}$ that is greater than the threshold voltage $V_{THL}$.

In order to provide a desired DC voltage in different countries, the power supply 200 needs to operate for a wide range of the AC input voltage Vin. In the embodiments as shown in FIGS. 6A-6C, take an example that the high input voltage is approximately 330 volts and the low input voltage is approximately 110 volts. In this illustrative example, the capacitance required at the low input voltage to provide for the same amount of hold-up time is roughly nine times at the high input voltage. The capacitance values of the capacitors $C_{LV1}$ 2000, capacitor $C_{LV2}$ 2002 and capacitor $C_{LV3}$ 2010 with the same voltage rating are the same. It is assumed that the capacitance, the voltage rating and the volume for each of $C_{LV1}$ 2000, $C_{LV2}$ 2002 and $C_{LV3}$ 2010 at the high input voltage Vin are $CAP_{LV}$, VTH and VOL, respectively. According to the solution of the present disclosure, to maintain the same hold-up time for both high input voltage and low input voltage, the total volume VOL' of the bulk capacitor including $C_{LV1}$ 2000, $C_{LV2}$ 2002 and $C_{LV3}$ 2010 required according to the present disclosure is calculated according to below equation (2):

$$VOL'=VOL_{LV1}+VOL_{LV2}+VOL_{LV3}=VOL+VOL+VOL=3VOL. \quad (2)$$

However, when applied to a prior art power supply as illustrate in FIG. 1, to maintain the same hold-up time for both high input voltage and low input voltage, the volume of the bulk capacitor for the prior art power supply is $9*(VOL_{LV1}+VOL_{LV2}+VOL_{LV3})$, i.e., 27VOL.

Therefore, in this illustrative example, the volume of the capacitors needed in a power supply is reduced by $$\frac{27VOL - 3VOL}{27VOL} = 89\%.$$

According to the embodiments of the present disclosure, the total physical size and cost of the bulk capacitor is reduced while providing wide operating voltage range on the bulk capacitor. The size and cost of the power supply is reduced accordingly.

Figure 7:
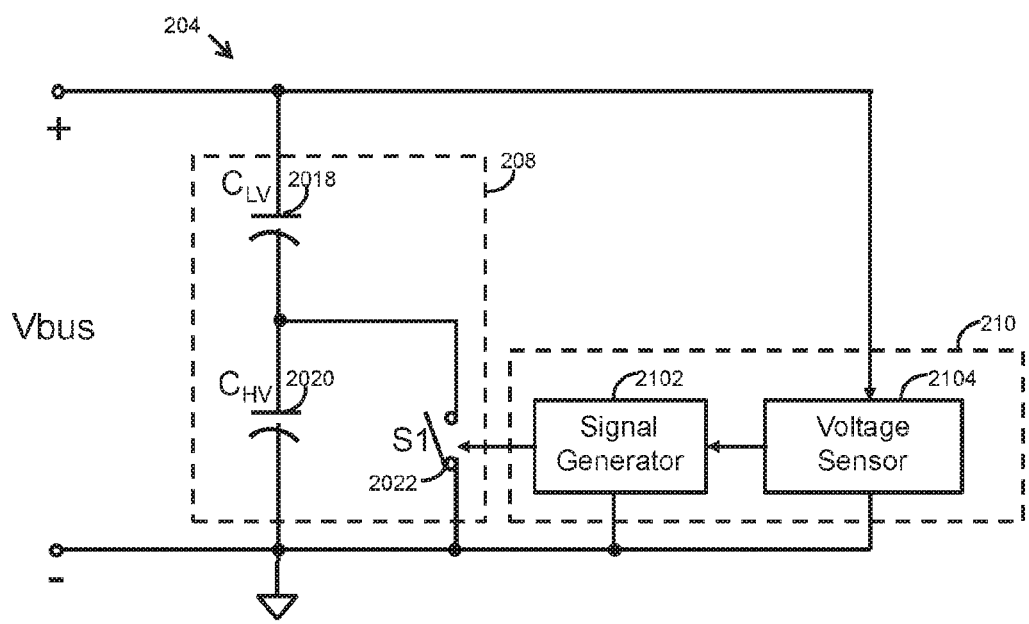
FIG. 7 illustrates a schematic diagram of a configurable impedance circuit depicted in FIG. 2A, FIG. 2B and FIG. 3, according to another embodiment of the present disclosure.

FIG. 7 illustrates a schematic diagram of a configurable impedance circuit depicted in FIG. 2A, FIG. 2B and FIG. 3, according to another embodiment of the present disclosure. It is understood that the configurable impedance circuit 204 of FIG. 7 may be implemented as a component of the power supply 200 as illustrated in FIG. 2A and FIG. 3. As illustrated in FIG. 7, the configurable impedance circuit 204 includes a configurable filter 208 and a controller 210.

In the embodiment of FIG. 7, the configurable filter 208 for filtering the rectified voltage Vbus includes a first capacitor $C_{LV}$ 2018, a second capacitor $C_{HV}$ 2020 and a switch S1 2022. The rectified voltage Vbus is a positive voltage in relation to a common input return. One terminal of the capacitor $C_{LV}$ 2018 is coupled to the rectified voltage Vbus. The other terminal of the capacitor $C_{LV}$ 2018 is coupled to the capacitor $C_{HV}$ 2020 and the switch S1 2022. The capacitor $C_{HV}$ 2020 and the switch S1 2022 are coupled in parallel.

The controller 210 as shown in FIG. 7 senses the rectified voltage Vbus and generates and sends a control signal to open or close the switch S1 2022 according to a comparison of the rectified voltage Vbus to at least one threshold voltage. The controller 210 includes a signal generator 2102 and a voltage sensor 2104. The voltage sensor 2104 is coupled to sense the rectified voltage Vbus. The signal generator 2102 is coupled to generate the control signal to open or close the switch S1 2022 based on the comparison of the rectified voltage Vbus to at least one threshold voltage. In one example, the signal generator 2102 generates a first control signal to open the switch S1 2022 if the rectified voltage Vbus as sensed is greater than or equal to a first threshold voltage $V_{THH}$. The first control signal is thus received by the configurable filter 208 and the switch S1 2022 is opened in response to the first control signal. As a result, the capacitor $C_{LV}$ 2018 and the capacitor $C_{HV}$ 2020 are coupled in series to the rectified voltage Vbus in response to the switch S1 2022 being open. In another example, the signal generator 2102 generates a second control signal to close the switch S1 2022 if the rectified voltage Vbus as sensed is less than or equal to a second threshold voltage $V_{THL}$. The second control signal is thus received by the configurable filter 208 and the switch S1 2022 is closed in response to the second control signal. As a consequence, the capacitor $C_{HV}$ 2020 is switched out by the switch S1 2022 being closed. Accordingly, only the capacitor $C_{LV}$ 2018 coupled in series with the switch S1 2022 operates to filter the rectified voltage Vbus in the configurable filter 208.

In the embodiment as shown in FIG. 7, it is understood that each of the capacitor $C_{LV}$ 2018 and the capacitor $C_{HV}$ 2020 may be realized by one or more individual capacitors. In one embodiment, the switch S1 2022 may include a MOSFET device. In one example, the threshold voltage $V_{THH}$ may be equal to the threshold voltage $V_{THL}$. In another example, hysteresis is introduced in the configurable impedance circuit 204 with the threshold voltage $V_{THH}$ that is greater than the threshold voltage $V_{THL}$. In order to provide a desired DC voltage in different countries, the power supply 200 needs to operate for a wide range of the AC input voltage Vin. Take an example that the high input voltage is approximately 220 volts and the low input voltage is approximately 110 volts. In this illustrative example, the capacitance required at the low input voltage to provide for the same amount of hold-up time is roughly four times at the high input voltage. The capacitance value of the capacitor $C_{LV}$ 2018 is 3 times of that of the capacitor $C_{HV}$ 2020.

When applied to a prior art power supply as illustrate in FIG. 1, it is assumed that the capacitance, the voltage rating and the volume for a bulk capacitor at the high input voltage Vin are $CAP_{HV}$, VTH and VOL, respectively. Usually, the volume of a capacitor is a function of its capacitance and a square of its voltage rating. Thus, to maintain the same hold-up time for both high input voltage and low input voltage, the volume of the bulk capacitor for the prior art power supply is 4*VOL.

According to the solution as shown in FIG. 7, to maintain the same hold-up time for both high input voltage and low input voltage, the total volume VOL' of the bulk capacitor including $C_{LV}$ 2018 and $C_{HV}$ 2020 required according to the present disclosure is calculated according to below equation (3):

$$VOL' = VOL_{HV} + VOL_{LV} = \left[\left(\frac{3VTH}{4VTH}\right)^2 * \left(\frac{4CHV}{3CHV}\right)\right] * VOL + \left[\left(\frac{VTH}{2VTH}\right)^2 * \left(\frac{4CHV}{CHV}\right)\right] * VOL = \frac{3}{4} * VOL + VOL = \frac{7}{4} * VOL. \quad (3)$$

Therefore, in this illustrative example, the volume of the capacitors needed in a power supply is reduced by $$\frac{4VOL - \frac{7}{4}VOL}{4VOL} = 56.25\%.$$

According to the embodiments of the present disclosure, the total physical size and cost of the bulk capacitor is reduced while providing wide operating voltage range on the bulk capacitor. The size and cost of the power supply is reduced accordingly.

Figure 8:
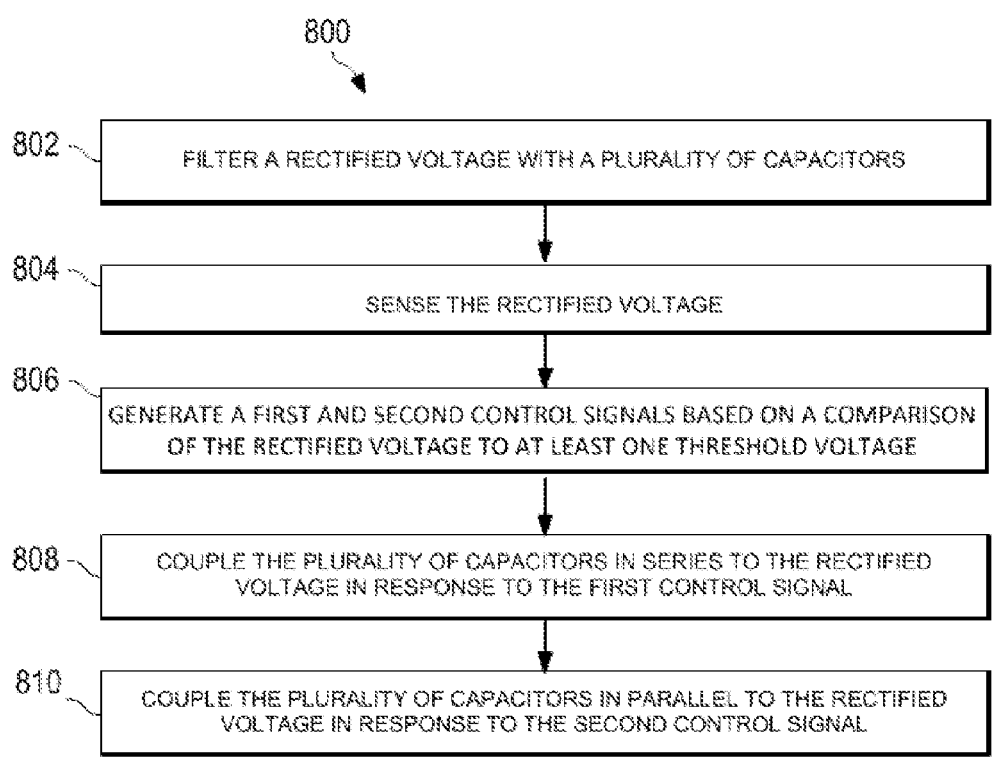
FIG. 8 is a flowchart that illustrates a method for filtering a rectified voltage according to one embodiment of the present disclosure.

FIG. 8 is a flowchart that illustrates a method 800 for filtering a rectified voltage according to one embodiment of the present disclosure. The method 800 of FIG. 8, when implemented, may be considered in relation to one or more of the embodiments described in relation to FIGS. 2A-7.

In block 802, a rectified voltage, e.g., the Vbus, is filtered with a plurality of capacitors. In one example, the plurality of capacitors may be the capacitor $C_{LV1}$ 2000 and the capacitor $C_{LV2}$ 2002. In another example, the plurality of capacitors may be the capacitor $C_{LV1}$ 2000, the capacitor $C_{LV2}$ 2002 and the capacitor $C_{LV3}$ 2010.

In block 804, the rectified voltage, e.g., the Vbus is sensed.

In block 806, after the Vbus is sensed, a first and second control signals are generated based on a comparison of the rectified voltage to at least one threshold voltage. In one example, in response to the rectified voltage Vbus being greater than a first threshold voltage, e.g., $V_{THH}$, the first control signal is generated and sent to the configurable filter 208. In response to the rectified voltage Vbus being less than a second threshold voltage, e.g., $V_{THL}$, the second control signal is generated and sent to the configurable filter 208.

In block 808, the plurality of capacitors are coupled in series to the rectified voltage Vbus in response to the first control signal. In one example, the switch S2 2006 is closed and the switch S1 2004 and switch S3 2008 are opened in response to the first control signal. As a result, the capacitor $C_{LV1}$ 2000 and the capacitor $C_{LV2}$ 2002 are coupled in series to the rectified voltage Vbus. In another example, the configurable filter 208 closes the switch S2 2006 and the switch S5 2014, and opens the switch S1 2004, switch S3 2008, switch S4 2012 and switch S6 2016 in response to the first control signal. As a result, the capacitor $C_{LV1}$ 2000, the capacitor $C_{LV2}$ 2002 and the capacitor $C_{LV3}$ 2010 are coupled in series to the rectified voltage Vbus.

In block 810, the plurality of capacitors are coupled in parallel to the rectified voltage Vbus in response to the second control signal. In one example, the configurable filter 208 closes the switch S1 2004 and switch S3 2008 and opens the switch S2 2006 in response to the second control signal. As a result, the capacitor $C_{LV1}$ 2000 and the capacitor $C_{LV2}$ 2002 are coupled in parallel to the rectified voltage Vbus. In another example, the configurable filter 208 closes the switch S1 2004, switch S3 2008, switch S4 2012 and switch S6 2016 and opens the switch S2 2006 and the switch S5 2014 in response to the second control signal. As a result, the capacitor $C_{LV1}$ 2000, the capacitor $C_{LV2}$ 2002 and the capacitor $C_{LV3}$ 2010 are coupled in parallel to the rectified voltage Vbus.

Figure 9:
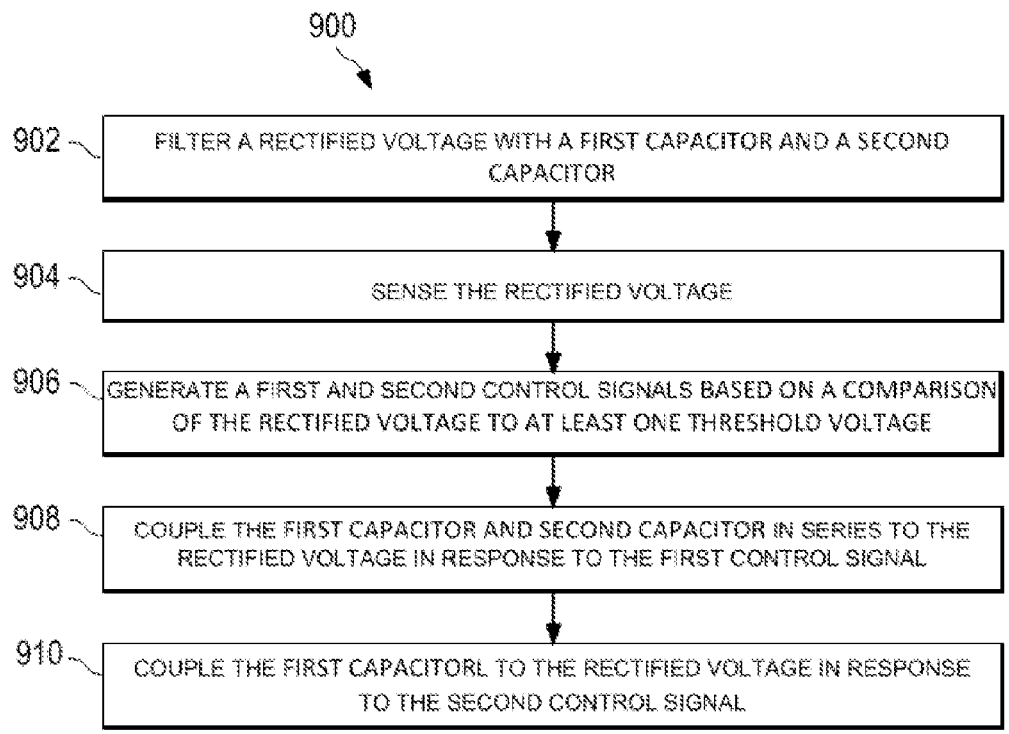
FIG. 9 is a flowchart that illustrates a method for filtering a rectified voltage according to another embodiment of the present disclosure.

FIG. 9 is a flowchart that illustrates a method 900 for filtering a rectified voltage according to another embodiment of the present disclosure. The method 900 of FIG. 9, when implemented, may be considered in relation to one or more of the embodiments described in relation to FIGS. 2A-7.

In block 902, a rectified voltage, e.g., the Vbus, is filtered with a first capacitor $C_{LV}$ 2018 and a second capacitor $C_{HV}$ 2020.

In block 904, the rectified voltage, e.g., the Vbus is sensed.

In block 906, after the Vbus is sensed, a first and second control signals are generated based on a comparison of the rectified voltage to at least one threshold voltage. In one example, in response to the rectified voltage Vbus being greater than a first threshold voltage, e.g., $V_{THH}$, the first control signal is generated and sent to the configurable filter 208. In response to the rectified voltage Vbus being less than a second threshold voltage, e.g., $V_{THL}$, the second control signal is generated and sent to the configurable filter 208.

In block 908, the capacitor $C_{LV}$ 2018 and the capacitor $C_{HV}$ 2020 are coupled in series to the rectified voltage Vbus in response to the first control signal. Upon receiving the first control signal, a switch S1 2022 is opened to couple the capacitor $C_{LV}$ 2018 and the capacitor $C_{HV}$ 2020 in series.

In block 910, the capacitor $C_{LV}$ 2018 is coupled to the rectified voltage Vbus in response to the second control signal. Upon receiving the second control signal, the switch S1 2022 is closed to switch out the capacitor $C_{HV}$ 2020. As a consequence, only the capacitor $C_{LV}$ 2018 coupled in series with the switch S1 2022 operates to filter the rectified voltage Vbus.

According to the embodiments method of the present disclosure, the total physical size and cost of the bulk capacitor is reduced while providing wide operating voltage range on the bulk capacitor. The size and cost of the power supply is reduced accordingly.

Figure 10:
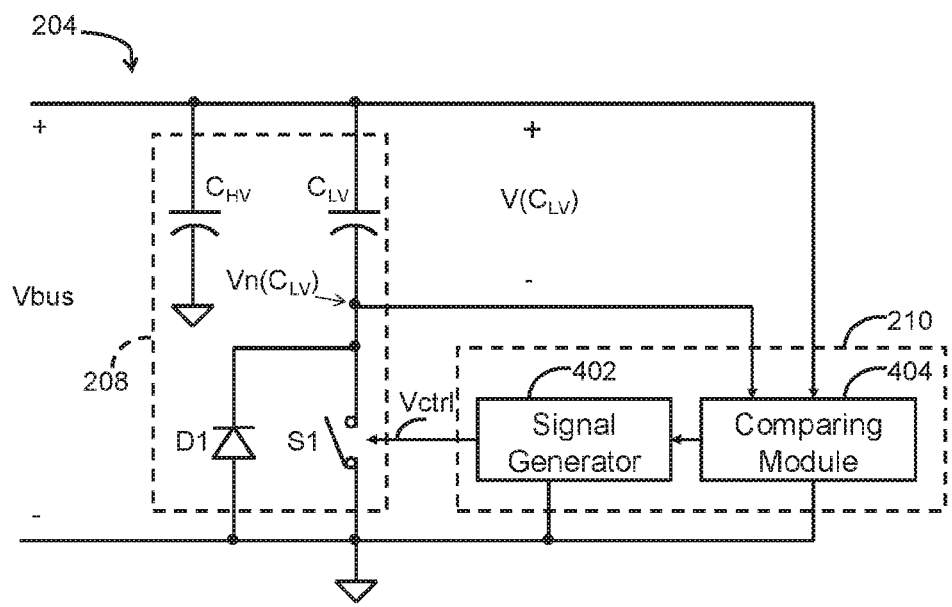
FIG. 10 illustrates a configurable impedance circuit, according to yet another embodiment of the present disclosure.

FIG. 10 illustrates a configurable impedance circuit, according to yet another embodiment of the present disclosure. Elements labeled or numbered the same as in FIGS. 2A-2B have similar functions. Commonly labeled or numbered elements won't be described again. As described, the configurable impedance circuit 204 includes the configurable filter 208 and the controller 210. In the example of FIG. 10, the configurable filter 208 includes a first capacitor $C_{HV}$, a second capacitor $C_{LV}$, a selectable switch S1 coupled in series with the second capacitor $C_{LV}$, and a diode D1 coupled in parallel with the selectable switch S1. The selectable switch S1 is coupled to receive a control signal Vctrl. The selectable switch S1 and the second capacitor $C_{LV}$ are selectively coupled in parallel with the first capacitor $C_{HV}$.

The controller 210 senses a differential voltage $V(C_{LV})$ across the second capacitor $C_{LV}$, and accordingly generates the control signal Vctrl to open or close the selectable switch S1 based on the differential voltage $V(C_{LV})$, so as to maintain a voltage range across the second capacitor $C_{LV}$.

In the example of FIG. 10, the controller 210 includes a comparing module 404 and a signal generator 402. The comparing module 404 is coupled to sense the differential voltage $V(C_{LV})$ by sensing the voltage Vbus and a voltage $Vn(C_{LV})$ at a node connected to the second capacitor $C_{LV}$ and the selectable switch S1. A difference of the voltage Vbus and the voltage $Vn(C_{LV})$ indicates the differential voltage $V(C_{LV})$ across the second capacitor $C_{LV}$. The comparing module 404 compares the differential voltage $V(C_{LV})$ with first and second threshold voltages $V_{THH}$ and $V_{THL}$. The signal generator 402 is configured to generate the control signal based on the comparison.

For example, whenever the differential voltage $V(C_{LV})$ is greater than or equal to the first threshold voltage $V_{THH}$, the signal generator 402 generates the control signal Vctrl in a first state (e.g., a low level) to open the selectable switch S1 to electrically remove the second capacitor $C_{LV}$. The switch S1 remains open until the differential voltage $V(C_{LV})$ reaches or falls below $V_{THL}$. Accordingly, the selectable switch S1 and the second capacitor $C_{LV}$ are not coupled in parallel with the first capacitor $C_{HV}$ while switch S1 is open and only the first capacitor $C_{HV}$ operates to filter the voltage Vbus.

Whenever the differential voltage $V(C_{LV})$ is less than or equal to the second threshold voltage $V_{THL}$, the signal generator 402 generates the control signal Vctrl in a second state (e.g., a high level) to close the selectable switch S1. Accordingly, the selectable switch S1 and the second capacitor $C_{LV}$ are coupled in series and are jointly coupled in parallel with the first capacitor $C_{HV}$. Operationally, when the selectable switch S1 is closed, the second capacitor $C_{LV}$ is coupled in parallel with the first capacitor $C_{HV}$. Therefore, the first capacitor $C_{HV}$ and the second capacitor $C_{LV}$ are configured in a parallel connection to filter the voltage Vbus and the total capacitance for these two capacitors is a sum of their capacitive values. In at least one embodiment, the switch S1 comprises an N-type metal-oxide-semiconductor field-effect transistor (MOSFET) that is an enhancement mode device that is normally off and that closes the connection to allow current flow with a proper gate voltage. The switch S1 remains closed until the differential voltage $V(C_{LV})$ reaches or exceeds $V_{THH}$. The selectable switch S1 is opened and closed alternately according to the differential voltage $V(C_{LV})$ across the second capacitor $C_{LV}$, causing the selectable switch S1 and the second capacitor $C_{LV}$ selectively coupled in parallel with the first capacitor $C_{HV}$.

Figure 11A:
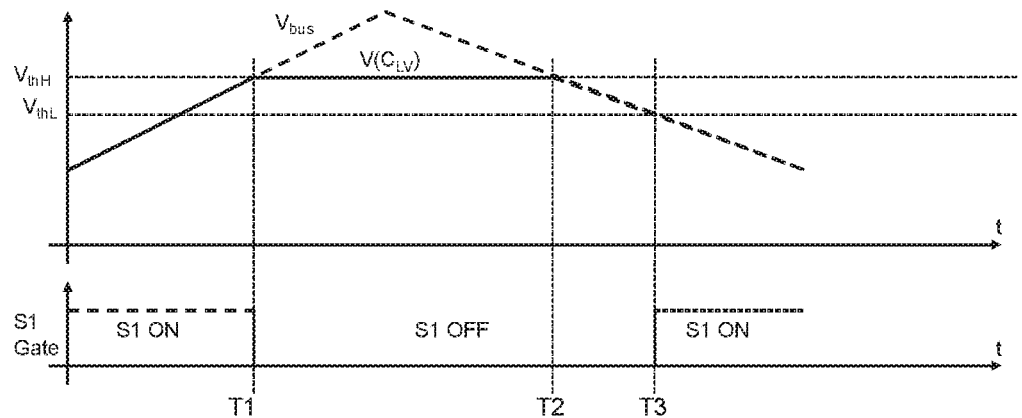
FIG. 11A and FIG. 11B illustrate waveform diagrams of the differential voltage $V(C_{LV})$ and the state of the selectable switch S1.
Figure 11B:
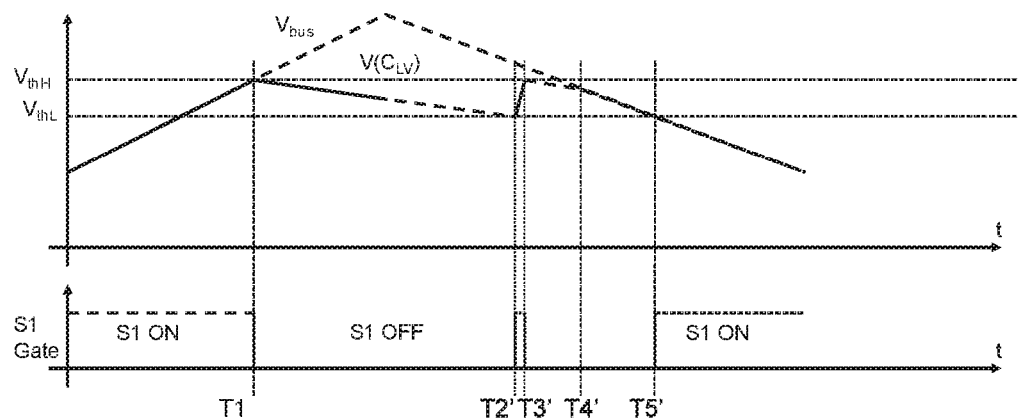

The detailed operations of the configurable filter 208 and the controller 206 will be described in relation to FIG. 11A and FIG. 11B FIG. 11A and FIG. 11B illustrate waveform diagrams of the differential voltage $V(C_{LV})$ and the state of the selectable switch S1 in an ideal situation and in a practical situation, respectively.

In the example of FIG. 11A, when the switch S1 is opened and the diode D1 is in reverse voltage blocking state, it is assumed that no net leakage current is flowing in or out of the voltage node $Vn(C_{LV})$ of the capacitor $C_{LV}$.

When the differential voltage $V(C_{LV})$ is rising and the differential voltage $V(C_{LV})$ is less than the first threshold voltage $V_{THH}$, the selectable switch S1 is closed. Since the selectable switch S1 is closed, the differential voltage $V(C_{LV})$ across the second capacitor $C_{LV}$ is equal to the rectified voltage Vbus. At time T1, in response to the differential voltage $V(C_{LV})$ rising to the first threshold voltage $V_{THH}$, the selectable switch S1 is opened. Because there is no net leakage current flowing through the second capacitor $C_{LV}$, the differential voltage $V(C_{LV})$ across the second capacitor $C_{LV}$ is maintained at the level of the first threshold voltage $V_{THH}$. When the differential voltage $V(C_{LV})$ drops below the second threshold voltage $V_{THL}$ at time T3, the selectable switch is closed and accordingly the differential voltage $V(C_{LV})$ is equal to the rectified voltage Vbus from time T3.

In the example of FIG. 11B, leakage current of $C_{LV}$ is accounted while the switch S1 is open and theoretically not conducting. When the differential voltage $V(C_{LV})$ is rising and the differential voltage $V(C_{LV})$ is less than the first threshold voltage $V_{THH}$, the selectable switch S1 is closed, and the differential voltage $V(C_{LV})$ across the second capacitor $C_{LV}$ is equal to the rectified voltage Vbus. At time T1, in response to the differential voltage $V(C_{LV})$ rising to the first threshold voltage $V_{THH}$, the selectable switch S1 is opened. When the selectable switch S1 is opened, the second capacitor $C_{LV}$ may be discharged by its own leakage current. Accordingly, the differential voltage $V(C_{LV})$ across the second capacitor $C_{LV}$ decreases. At time point T2', when the differential voltage $V(C_{LV})$ drops to the second threshold voltage $V_{THL}$, the switch is closed momentarily to charge the second capacitor $C_{LV}$ until the differential voltage $V(C_{LV})$ exceeds the first threshold voltage $V_{THH}$ at time T3'. Similarly, from time T3', the selectable switch S1 is opened and the differential voltage $V(C_{LV})$ starts to slowly decrease again. From time T5', the selectable switch S1 is closed and accordingly the differential voltage $V(C_{LV})$ is equal to the rectified voltage Vbus from time T5'.

Therefore, according to one embodiment of the present disclosure, the selectable switch S1 and the second capacitor $C_{LV}$ are selectively coupled in parallel with the first capacitor $C_{HV}$. By utilizing a topology that includes the first capacitor $C_{HV}$ and the selectable second capacitor $C_{LV}$, the total physical size of the capacitors is reduced and the size of the power supply is reduced accordingly.

The volume of a capacitor is a function of its capacitance and a square of its voltage rating. An example is discussed for the capacitances of the first capacitor $C_{HV}$ and the second capacitor $C_{LV}$ in the following. It is noted that each of the capacitances $C_{HV}$ and $C_{LV}$ may be realized by one or more individual capacitors.

In the power supply, the rectified voltage Vbus desirably maintains a constant level. Because of imperfect performance, however, the voltage across $C_{LV}$ may decrease while the switch S1 is open due to leakage. Accordingly, voltage levels $V_{THH}$ and $V_{THL}$ are defined to provide hysteresis to prevent excessive switching. In addition, the voltage $V(C_{LV})$ varies between upper and lower peak values that substantially correspond with $V_{THH}$ and $V_{THL}$. When the AC power source 201 is removed or suddenly fails, the DC/DC converter 206 responds to this falling voltage by expanding its duty cycle in order to maintain output voltage regulation. At a certain voltage of the rectified voltage Vbus, the duty cycle reaches its maximum limit and output voltage regulation is no longer maintained. This lowest operating voltage point of the voltage Vbus and the full load rating determine the amount of capacitance needed to satisfy the hold-up requirement.

In order to provide a desired DC voltage signal in different countries, the power supply needs to operate for a wide range of the AC input voltage Vin. For example, in some countries or regions, the amplitude of the AC input voltage Vin is 110 volts while in some others, the amplitude is 220 volts. When the AC input voltage Vin is high enough, only a small capacitance is required to the rectified voltage Vbus from going below a minimum desired value for the DC/DC converter 206. When the AC input voltage Vin is low enough, a large capacitance is required to keep the valley of the rectified voltage Vbus from going below the minimum desired value.

The energy stored in the capacitor $C_{HV}$ when the selectable switch S1 is opened, or energy stored in the capacitors $C_{HV}$ and $C_{LV}$ when the selectable switch S1 is closed, is used to provide the necessary temporary power for the load when the input power source Vin goes out. Take an example that the high input voltage is 220 volts and the low input voltage is 110 volts. In this illustrative example, the capacitance required at the low input voltage to provide for the same amount of hold-up time is roughly four times at the high input voltage. Assuming the capacitance needed for the high input voltage is the capacitance $CAP_{HV}$, so the capacitance needed for the power supply for the low input voltage is 4 times of the capacitance $CAP_{HV}$. Considering the capacitance of the configurable filter 208 equals the sum of the capacitance of the first capacitor $C_{HV}$ and the second capacitor $C_{LV}$ when the switch S1 is closed, the capacitance of $C_{LV}$ is 3 times of $CAP_{HV}$.

As described, when the differential voltage $V(C_{VL})$ is greater than or equal to the first threshold voltage $V_{THH}$, only the first capacitor $C_{HV}$ is operating. When the differential voltage $V(C_{VL})$ is less than or equal to the second threshold voltage $V_{THL}$, both the first capacitor $C_{HV}$ and the second capacitor $C_{LV}$ are operating. Therefore, the first capacitor $C_{HV}$ has a high voltage rating while the second capacitor $C_{LV}$ has a low voltage rating. In this illustrative example, the ratio of the voltage ratings of $C_{HV}$ and $C_{LV}$ is equal to 2:1.

When using a prior art power supply as illustrate in FIG. 1, in order to cover a range from a low input voltage to a high input voltage of Vin, a large capacitance is needed at the low input voltage, and when at the high input voltage, a high voltage rating is needed. Assuming the capacitance, the voltage rating and the volume for a bulk capacitor at the high input voltage Vin are $CAP_{HV}$, VTH and VOL, respectively. Usually, the volume of a capacitor is a function of its capacitance and a square of its voltage rating. So, the volume of the bulk capacitor for the prior art power supply, in order to cover a range from a low Vin to a high Vin, is 4*VOL.

According to the solution of the present disclosure, the first capacitor and the second capacitor are in parallel connection when the input voltage Vin is low. In combination with the discussion of the capacitances and voltage ratings for the first capacitor $C_{HV}$ and the second capacitor $C_{LV}$, the total volume VOL' of the capacitors required according to the present disclosure is calculated according to below equation (4):

$$VOL' = VOL_H + VOL_V = \qquad (4)$$
$$VOL + \left[\left(\frac{VTH}{2VTH}\right)^2 * \left(\frac{3CHV}{CHV}\right)\right] * VOL = VOL + \frac{3}{4} * VOL = \frac{7}{4} * VOL.$$

Therefore, in this illustrative example, the volume of the capacitors needed in a power supply is reduced by $$\frac{4VOL - \frac{7}{4}VOL}{4VOL} = 56.25\%$$

In addition, according to one embodiment of the present disclosure, the differential voltage $V(C_{LV})$ across the second capacitor $C_{LV}$ is sensed and used to generate the control signal Vctrl to open and close the selectable switch S1. Advantageously, the differential voltage $V(C_{LV})$ across the second capacitor $C_{LV}$ is maintained between the first threshold voltage $V_{TTH}$ and the second threshold $V_{THL}$, even when the voltage $Vn(C_{LV})$ at the node connected to the second capacitor $C_{LV}$ and the selectable switch S1 is floating during the time duration in which the selectable switch S1 is opened. Thus, the selectable switch S1 with a relatively low voltage rating can be used in the power supply, which reduces the size of the switch S1 and further reduces the size of the power supply.

Referring back to FIG. 10, the configurable filter 208 further includes a diode D1 coupled in parallel with the selectable switch S1. In an alternative embodiment, the selectable switch S1 has a body diode D1'. The following description takes the diode D1 coupled in parallel with the selectable switch S1 as an example. The operation of D1' is similar to D1.

The waveform of the rectified voltage Vbus depends on the waveform of the AC input voltage Vin. When the selectable switch S1 is opened, the rectified voltage Vbus may drop. Once the rectified voltage Vbus drops to the value of the differential voltage $V(C_{LV})$ across the second capacitor $C_{LV}$, the diode D1 is closed and allows current to pass through the selectable switch S1 in one direction. Accordingly, the differential voltage $V(C_{LV})$ is adjusted or "clamped" to be equal to the rectified voltage Vbus.

For example, in FIG. 11A, the rectified voltage Vbus drops to the value of the differential voltage $V(C_{LV})$ at time T2. Therefore, the differential voltage $V(C_{LV})$ is adjusted to be equal to the level of the rectified voltage Vbus in advance from time T2. Similarly, in FIG. 11B, the differential voltage $V(C_{LV})$ is adjusted to be equal to the level of the rectified voltage Vbus from time T4'.

Figure 12:
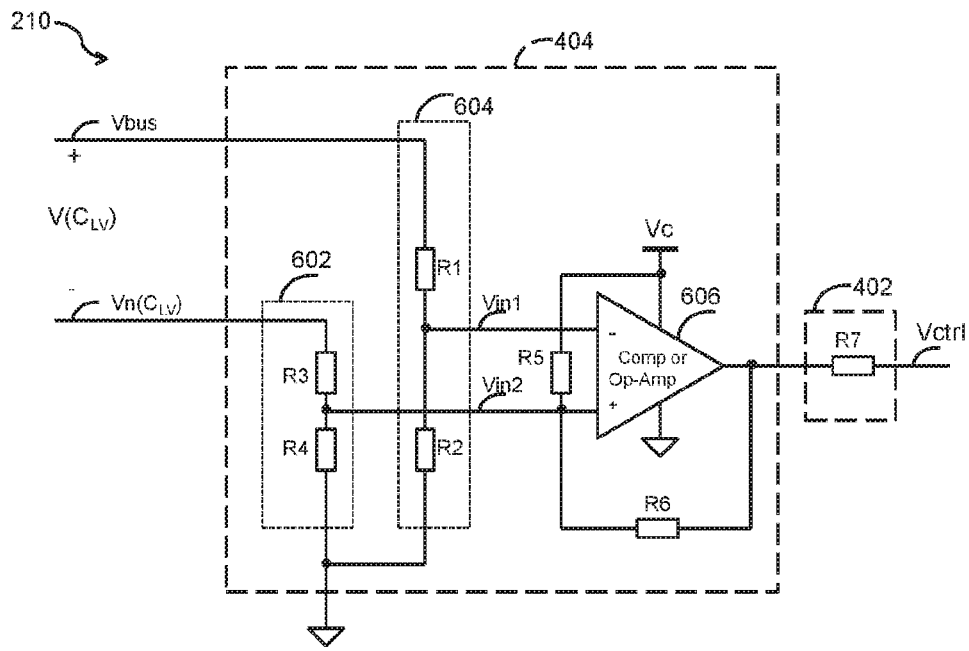
FIG. 12 illustrates a controller, according to one embodiment of the present disclosure.

FIG. 12 illustrates a comparing module according to one embodiment of the present disclosure. Elements labeled or numbered the same as in FIG. 10 have similar functions. Commonly labeled or numbered elements won't be described again.

As discussed, the controller 210 includes the comparing module 404 and the signal generator 402. In the example shown in FIG. 12, the comparing module 404 includes a first voltage divider 604, a second voltage divider 602, and a comparator 606 (or an operational amplifier (Op-Amp)). The first voltage divider 604 is coupled to receive the voltage Vbus and generates a first input signal Vin1 indicative of the voltage Vbus. The second divider 606 is coupled to receive the voltage Vn($C_{LV}$) and generates a second input signal Vin2 indicative of the voltage Vn($C_{LV}$). The comparator 606 is coupled to receive the first input signal Vin1 and the second input signal Vin2, and compares the first input signal Vin1 and the second input signal Vin2. The signal generator 402 may use an additional drive stage to generate the control signal Vctrl based on the comparison result. As a simplified solution as shown in FIG. 12, a damping resistor R7 is used to connect the output of the comparator 606 and the control signal Vctrl.

More specifically, the first divider 604 includes a first resistor R1 and a second resistor R2 coupled in series for receiving the voltage Vbus. The first divider 604 generates the first input signal Vin1 at a node connected to the first resistor R1 and the second resistor R2.

The second divider 602 includes a third resistor R3 and a fourth resistor R4 coupled in series for receiving the voltage Vn($C_{LV}$). The second divider 602 generates the second input signal Vin2 at a node connected to the third resistor R3 and the fourth resistor R4.

The comparator 606 has a first input terminal "−", a second input terminal "+" and an output terminal. For example, the comparator 606 can be implemented by a Schmitt trigger. The first input terminal is coupled to receive the first input signal Vin1. The second input terminal is coupled to receive the second input signal Vin2. The second input terminal is further coupled to a supply voltage Vc for the comparator 606 through a resistor R5. Therefore, the resistors R4 and R5 create a reference voltage for the comparator 606.

Hysteresis is introduced by including a resistor R6 coupled between the output terminal and the second input terminal of the comparator 606, to establish the first and second threshold voltages $V_{THH}$ and $V_{THL}$. A threshold hysteresis is Vthhys=$V_{THH}$−$V_{THL}$. With the hysteresis, the comparison between the differential voltage V($C_{LV}$) across the second capacitor $C_{LV}$ and $V_{THH}$ $V_{THL}$ is implemented by comparing the first input signal Vin1 and the second input signal Vin2.

In the example in FIG. 12, Vin1 can be obtained according to the equation (5). When the selectable switch S1 is closed, Vin2 can be obtained according to the equation (6). When the selectable switch S1 is opened, a forward conduction voltage Vdio of the diode D1 maybe further considered, and Vin2 can be obtained according to the equation (7). For example, Vdio=−0.7 volts.

$$Vin1 = \frac{R2}{R1+R2} * Vbus; \quad (5)$$

$$Vin2 = R_{3456} * \left(\frac{Vc}{R5} + \frac{Vout}{R6} + \frac{Vn}{R3}\right); \quad (6)$$

$$Vin2 = R_{3456} * \left(\frac{Vc}{R5} + \frac{Vout}{R6} - \frac{Vdio}{R3} + \frac{Vn}{R3}\right). \quad (7)$$

R1, R2, R3, R4, R5 and R6 represent the resistance of resistors R1, R2, R3, R4, R5 and R6, respectively. $R_{3456}$ has a value equal to $$\frac{1}{\frac{1}{R3}+\frac{1}{R4}+\frac{1}{R5}+\frac{1}{R6}},$$

that is, $R_{3456}$ represents an equivalent resistance when R3, R4, R5 and R6 are connected in parallel. Vn equals the voltage Vn($C_{LV}$). Vout represents the voltage at the output terminal of the comparator 606. Vout is equal to a high-level VH or a low-level VL based on the comparison result of the comparator 606.

The operation of the comparing module 404 is described in combination with FIG. 11B.

When the switch S1 is closed, Vin2 is obtained and maintained according to the above equation (6) and the output voltage Vout of the comparator 606 is VH. The voltage level of Vin1 increases when the capacitors are charged. When Vin1 is greater than Vin2, the output voltage Vout of the comparator 606 is switched from VH to VL.

In the example of FIG. 12, the resistances of the resistors satisfy:

$$\frac{R1+R2}{R2} * \frac{R3456}{R3} = 1.$$

Since a difference of the voltage Vbus and the voltage Vn($C_{LV}$) indicates the differential voltage V($C_{LV}$) across the second capacitor $C_{LV}$. Therefore, the above comparison when the switch S1 is closed can be derived as the equation (8):

$$V(C_{LV}) = \quad (8)$$
$$Vbus - Vn > \left(1 + \frac{R1}{R2}\right) * R3456 * \left(\frac{Vc}{R5} + \frac{VH}{R6}\right) = \frac{R3}{R5} * Vc + \frac{R3}{R6} * VH.$$

Therefore, the comparing of Vin1 and Vin2 can be equaled to comparing of V($C_{LV}$) and the first threshold voltage $V_{THH}$. The first threshold voltage has a value of $$V_{THH} = \frac{R3}{R5} * Vc + \frac{R3}{R6} * VH.$$

In response to the output voltage Vout of the comparator 606 switched to VL, the switch S1 is open, and Vin2 is obtained according to the above equation (7). The leak current of the open switch S1 may discharge the second capacitor $C_{LV}$. When Vin1 is less than Vin2, the output voltage Vout of the comparator 606 is switched from VL to VH. Similarly, the comparison when the switch S1 is open can be derived as the equation (9):

$$V(C_{LV}) = Vbus - Vn < \left(1 + \frac{R1}{R2}\right) * R3456 * \left(\frac{Vc}{R5} + \frac{VL}{R6} - \frac{Vdio}{R3}\right) = \quad (9)$$
$$\frac{R3}{R5} * Vc + \frac{R3}{R6} * VL - Vdio.$$

Therefore, the comparing of Vin1 and Vin2 can be equaled to comparing of V($C_{LV}$) and the second threshold voltage $V_{THL}$. The second threshold voltage has a value of $$V_{THL} = \frac{R3}{R5} * Vc + \frac{R3}{R6} * VL - Vdio.$$

Therefore, according to the comparing module 404 in FIG. 12, the comparison between the differential voltage V(C$_{LV}$) across the second capacitor C$_{LV}$ and V$_{THH}$ V$_{THL}$ is implemented by comparing the first input signal Vin1 and the second input signal Vin2. The controller 210 controls values of the first and second threshold voltages based on a configuration of the first voltage divider 602. For example, the values of the first and second threshold voltages are at least determined based on the resistances of R3, R5 and R6. And the threshold hypothesis is $$Vthhys = V_{THH} - V_{THL} = \frac{R3}{R6} * (VH - VL) + Vdio.$$

It is noted that the controller 210 may have other configurations, and is not limited to the example shown in FIG. 12.

Figure 13:
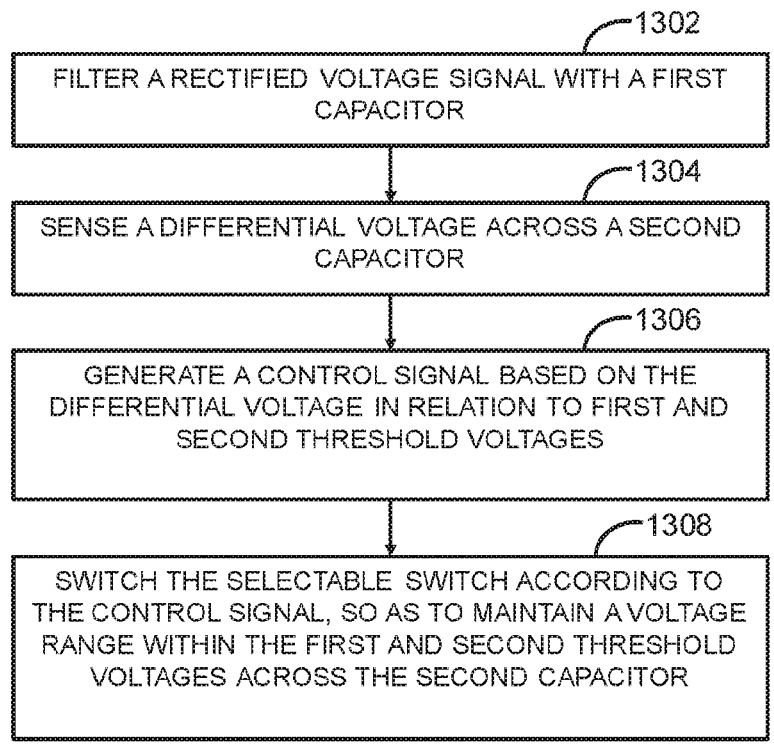
FIG. 13 is a flowchart that illustrates a method for producing a DC voltage according to one embodiment of the present disclosure.

FIG. 13 is a flowchart 1300 that illustrates a method for producing a DC voltage according to one embodiment of the present disclosure. The method of FIG. 13 should be considered in relation to one or more of the embodiments described in relation to FIGS. 2-3 and 10-12. Although specific steps are disclosed in FIG. 13, such steps are examples. In other words, the embodiments of the disclosure may include different steps or different combinations of steps and the embodiments are not limited to what is shown in FIG. 13.

In block 1302, a rectified voltage signal, e.g., the Vbus, is filtered with a first capacitor, e.g., the capacitor C$_{HV}$. Thereafter, in block 1304, a differential voltage V(C$_{LV}$) across a second capacitor, e.g., the capacitor C$_{LV}$, is sensed or measured. The second capacitor is coupled in series with a selectable switch, e.g., the switch S1, and the selectable switch and the second capacitor are selectively coupled in parallel with the first capacitor. After sensing or measuring V(C$_{LV}$), in block 1306, a control signal, e.g., the control signal Vctrl, is generated based on the differential voltage across the second capacitor in relation to first and second threshold voltages, e.g., V$_{THH}$ and V$_{THL}$. In one embodiment, in response to the differential voltage across the second capacitor rising to the first threshold voltage, the control signal in a first state, e.g., a low level, is generated and produced to a selectable switch that is connected. In response to the differential voltage dropping to the second threshold voltage, the control signal in a second state, e.g., a high level, is generated and produced to the selectable switch.

In block 1308, the selectable switch is switched according to the control signal, so as to maintain a voltage range within the first and second threshold voltages across the second capacitor. In one embodiment, the selectable switch is opened in response to the control signal being in the first state, and is closed in response to the control signal being in the second state.

In one embodiment, the differential voltage may be further adjusted to be equal to the rectified voltage signal if the rectified voltage signal drops below the differential voltage.

While several embodiments have been provided in the present disclosure, it should be understood that the disclosed circuits and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

What is claimed is:

1. A configurable impedance circuit comprising:
   a controller that generates a control signal based on a comparison of a rectified voltage to at least one voltage threshold, the generating comprising:
     generating the control signal in response to the rectified voltage being larger than or equal to the at least one voltage threshold, or being less than or equal to the at least one voltage threshold; and
   a filter coupled to the controller and comprising a plurality of capacitors, with the filter receiving the control signal, configuring the plurality of capacitors in accordance with the control signal, and filtering the rectified voltage using the configured plurality of capacitors, the configuring comprising:
     configuring the plurality of capacitors in series connection in response to the control signal corresponding to the rectified voltage being larger than or equal to the at least one voltage threshold, or configuring the plurality of capacitors in parallel connection in response to the control signal corresponding to the rectified voltage being less than or equal to the at least one voltage threshold.

2. The configurable impedance circuit of claim 1, wherein the filter further comprises a plurality of switches;
   the plurality of switches comprises a first switch, a second switch and a third switch, and the plurality of capacitors comprises a first capacitor and a second capacitor;
   the first and second capacitors are coupled in series in response to the first switch and the third switch being open and the second switch being closed; and
   the first and second capacitors are coupled in parallel in response to the first switch and the third switch being closed and the second switch being open.

3. The configurable impedance circuit of claim 2, wherein the second switch couples in series with the first capacitor and the second capacitor upon the first switch and the third switch being open and the second switch being closed; and
   the first switch couples in series with the first capacitor, the third switch couples in series with the second capacitor, and the first switch and the first capacitor couple in parallel with the third switch and the second capacitor upon the first switch and the third switch being closed and the second switch being open.

4. The configurable impedance circuit of claim 2, wherein the second switch couples in series with the first capacitor and the second capacitor upon the first switch and the third switch being open and the second switch being closed; and
   the third switch couples in series with the second capacitor, and the third switch and the second capacitor couple in parallel with the first capacitor upon the first switch and the third switch being closed and the second switch being open.

5. The configurable impedance circuit of claim 2, wherein the first capacitor and the second capacitor have the same capacitance values.

6. The configurable impedance circuit of claim 2, wherein each of the first switch, second switch and third switch comprises a metal-oxide-semiconductor field-effect transistor (MOSFET).

7. A power supply, comprising:
a rectifier that receives an alternating current (AC) voltage and rectifies the AC voltage to produce a rectified voltage;
a configurable impedance circuit coupled to receive and filter the rectified voltage to produce a filtered direct current (DC) voltage, wherein the configurable impedance circuit comprises:
a controller that generates a control signal based on a comparison of the rectified voltage to at least one voltage threshold, the generating comprising:
generating the control signal in response to the rectified voltage being larger than or equal to the at least one voltage threshold, or being less than or equal to the at least one voltage threshold; and
a filter coupled to the controller and comprising a plurality of capacitors, with the filter receiving the control signal, configuring the plurality of capacitors in accordance with the control signal, and filtering the rectified voltage using the configured plurality of capacitors, the configuring comprising:
configuring the plurality of capacitors in series connection in response to the control signal corresponding to the rectified voltage being larger than or equal to the at least one voltage threshold, or configuring the plurality of capacitors in parallel connection in response to the control signal corresponding to the rectified voltage being less than or equal to the at least one voltage threshold.

8. The power supply of claim 7, wherein the filter further comprises a plurality of switches;
the plurality of switches comprises a first switch, a second switch and a third switch, and the plurality of capacitors comprises a first capacitor and a second capacitor;
the first and second capacitors are coupled in series in response to the first switch and the third switch being open and the second switch being closed; and
the first and second capacitors are coupled in parallel in response to the first switch and the third switch being closed and the second switch being open.

9. The power supply of claim 8, wherein
the second switch couples in series with the first capacitor and the second capacitor upon the first switch and the third switch being open and the second switch being closed; and
the first switch couples in series with the first capacitor, the third switch couples in series with the second capacitor, and the first switch and the first capacitor couple in parallel with the third switch and the second capacitor upon the first switch and the third switch being closed and the second switch being open.

10. The power supply of claim 8, wherein
the second switch couples in series with the first capacitor and the second capacitor upon the first switch and the third switch being open and the second switch being closed; and the third switch couples in series with the second capacitor, and the third switch and the second capacitor couple in parallel with the first capacitor upon the first switch and the third switch being closed and the second switch being open.

11. The power supply of claim 8, wherein the first capacitor and the second capacitor have the same capacitance values.

12. The power supply of claim 8, wherein each of the first switch, second switch and third switch comprises a metal-oxide-semiconductor field-effect transistor (MOSFET).

13. The power supply of claim 7, wherein the power supply further comprises a DC to DC converter that receives the filtered DC voltage and converts the filtered DC voltage to provide a second DC voltage.

14. A method for filtering a rectified voltage, comprising:
generating a control signal based on a comparison of the rectified voltage to at least one voltage threshold, comprising:
generating the control signal in response to the rectified voltage being larger than or equal to the at least one voltage threshold, or being less than or equal to the at least one voltage threshold; and
configuring the plurality of capacitors in accordance with the control signal, and filtering the rectified voltage using the configured plurality of capacitors, the configuring comprising:
configuring the plurality of capacitors in series connection in response to the control signal corresponding to the rectified voltage being larger than or equal to the at least one voltage threshold, or configuring the plurality of capacitors in parallel connection in response to the control signal corresponding to the rectified voltage being less than or equal to the at least one voltage threshold.

15. The method of claim 14, wherein the plurality of capacitors comprises a first capacitor and a second capacitor,
wherein the plurality of capacitors are coupled in series by opening a first switch and a second switch and closing a third switch; and
wherein the plurality of capacitors are coupled in parallel by closing a first switch and a second switch and opening a third switch.

16. The method of claim 15, wherein
the first switch couples in series with the first capacitor, the second switch couples in series with the second capacitor, and the first switch and the first capacitor couple in parallel with the second switch and the second capacitor upon the first switch and the second switch being closed and the third switch being open; and
the third switch couples in series with the first capacitor and the second capacitor upon the first switch and the second switch being open and the third switch being closed.

17. The method of claim 15, wherein
the second switch couples in series with the second capacitor, and the second switch and the second capacitor couple in parallel with the first capacitor upon the first switch and the second switch being closed and the third switch being open; and
the third switch couples in series with the first capacitor and the second capacitor upon the first switch and the second switch being open and the third switch being closed.

18. The method of claim 15, wherein the first capacitor and the second capacitor have the same capacitance values.

\* \* \* \* \*